United States Patent
Kobayashi

(10) Patent No.: US 7,952,713 B2
(45) Date of Patent: May 31, 2011

(54) BONDING AGENT STICKING INSPECTION APPARATUS, MOUNTING APPARATUS, AND METHOD OF MANUFACTURING ELECTRICAL COMPONENT

(75) Inventor: Daisuke Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 449 days.

(21) Appl. No.: 12/209,637

(22) Filed: Sep. 12, 2008

(65) Prior Publication Data
US 2009/0073445 A1 Mar. 19, 2009

(30) Foreign Application Priority Data

Sep. 13, 2007 (JP) .................................. 2007-238446

(51) Int. Cl.
*G01B 11/00* (2006.01)
(52) U.S. Cl. ....................................................... 356/394
(58) Field of Classification Search .......... 356/392–394, 356/237.1–237.5
See application file for complete search history.

(56) References Cited

U.S. PATENT DOCUMENTS

| 6,924,875 B2 * | 8/2005 | Tomita | 349/192 |
| 7,800,568 B2 * | 9/2010 | Kang et al. | 345/87 |
| 7,850,800 B2 * | 12/2010 | Ueno et al. | 156/64 |

FOREIGN PATENT DOCUMENTS

JP 2001-21333 1/2001

* cited by examiner

*Primary Examiner* — Michael P Stafira
(74) *Attorney, Agent, or Firm* — Oblon, Spivak, McClelland, Maier & Neustadt, L.L.P.

(57) ABSTRACT

A bonding agent sticking inspection apparatus includes a photographing section, a movement section, and a control section. The photographing section photographs an image of a substrate. The image includes a sticking expected range indicating a range in which a bonding agent should be positioned. The control section controls the photographing section and the movement section, sets an inspection region having a width equal to the pitch between electrodes in an entire edge part in a direction in which the electrodes are arranged in a peripheral edge part of the sticking expected range in the image, detects a ratio of a nicked part of the bonding agent to the inspection region, and judges whether or not an abnormality is present in the bonding agent on the basis of a comparison between the ratio of the nicked part and a threshold set in advance.

6 Claims, 13 Drawing Sheets

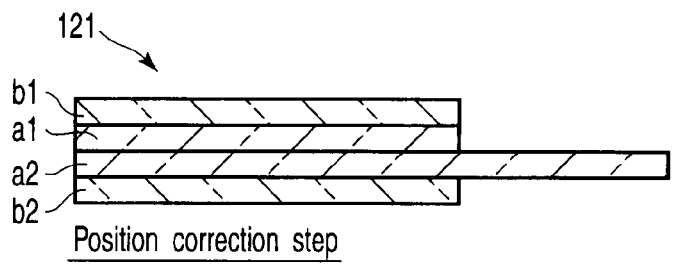
FIG. 3A — Position correction step
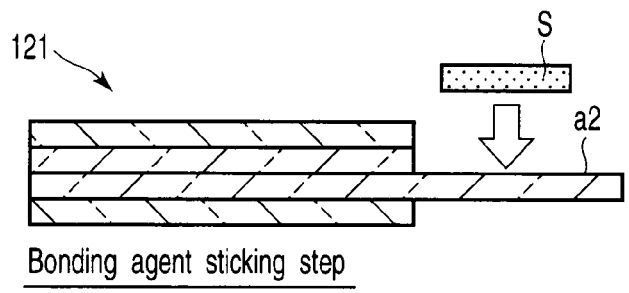
FIG. 3B — Bonding agent sticking step
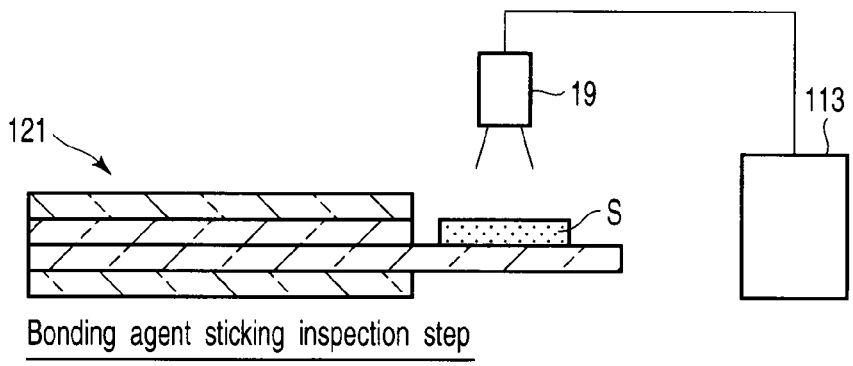
FIG. 3C — Bonding agent sticking inspection step
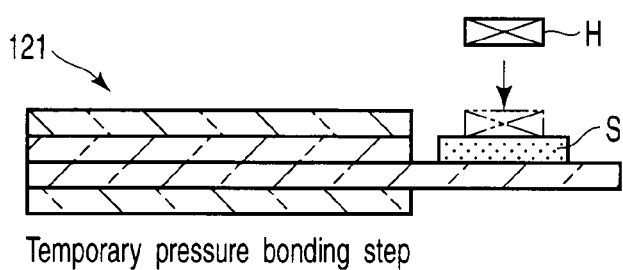
FIG. 3D — Temporary pressure bonding step
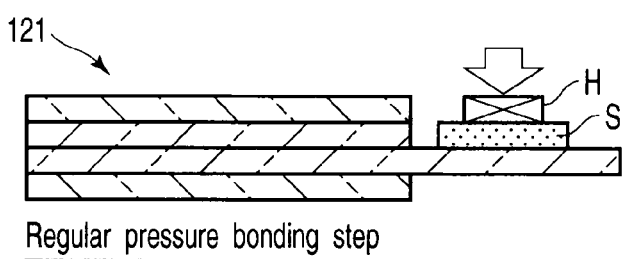
FIG. 3E — Regular pressure bonding step

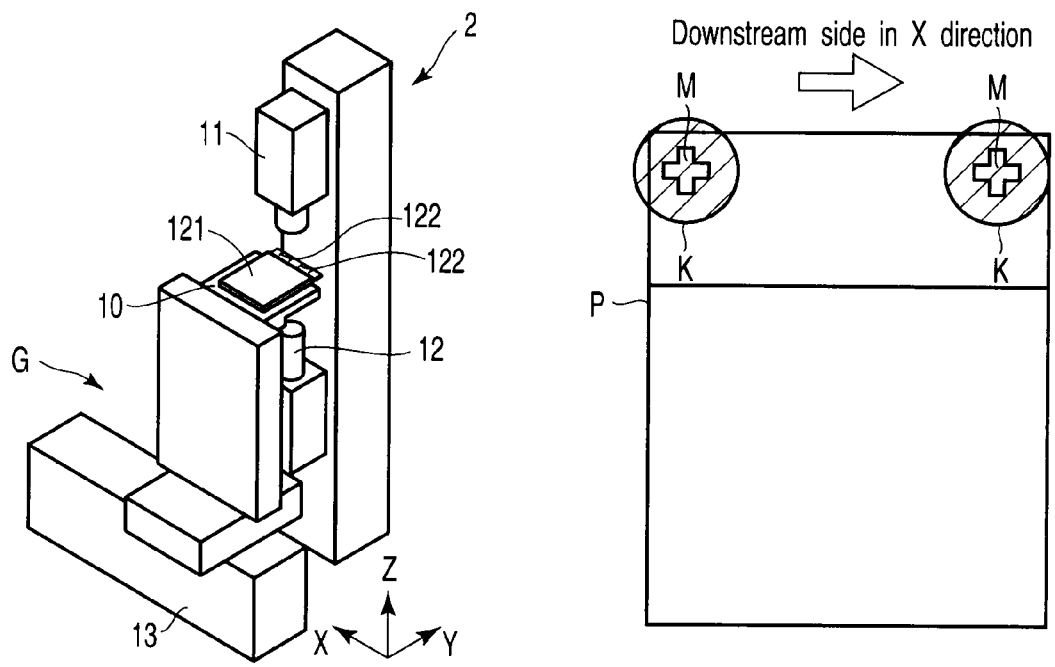
FIG. 5A
FIG. 5B
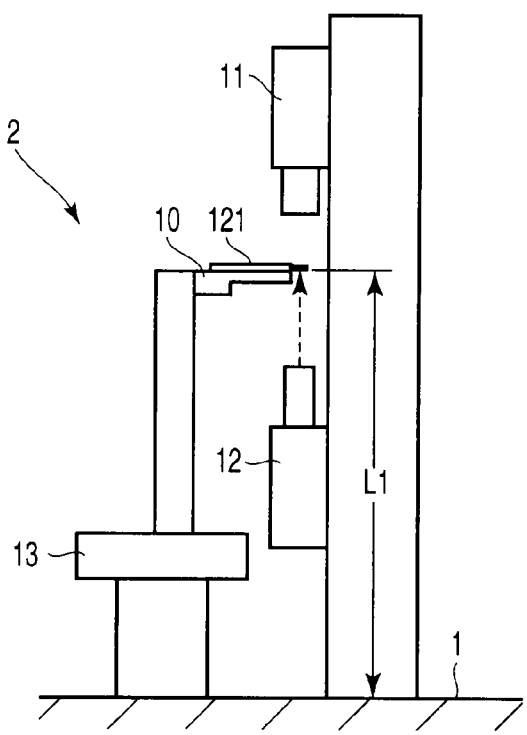
FIG. 6

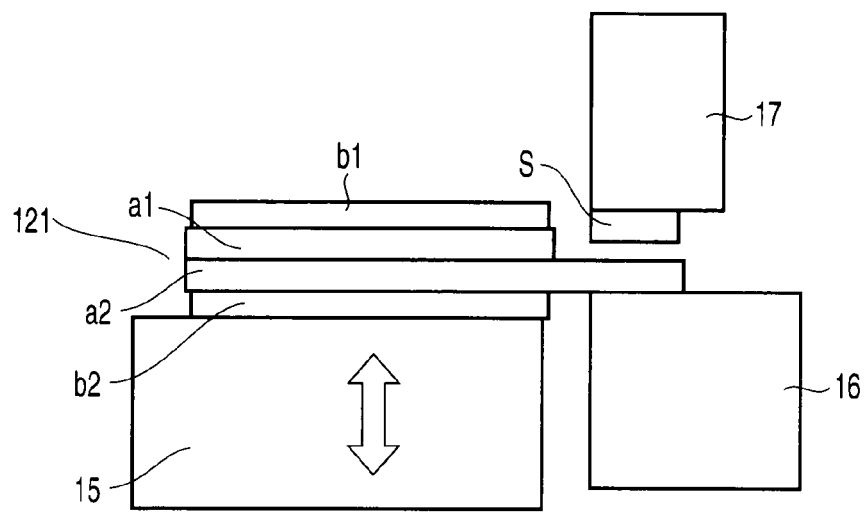
F I G. 8
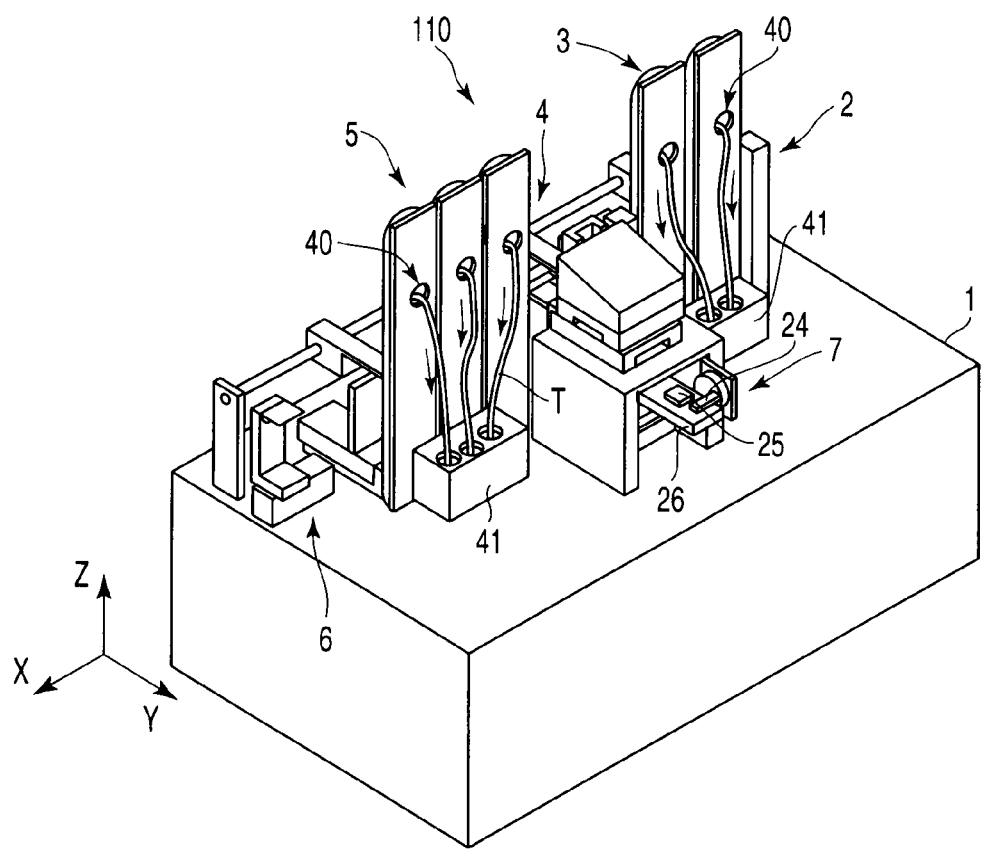
F I G. 9

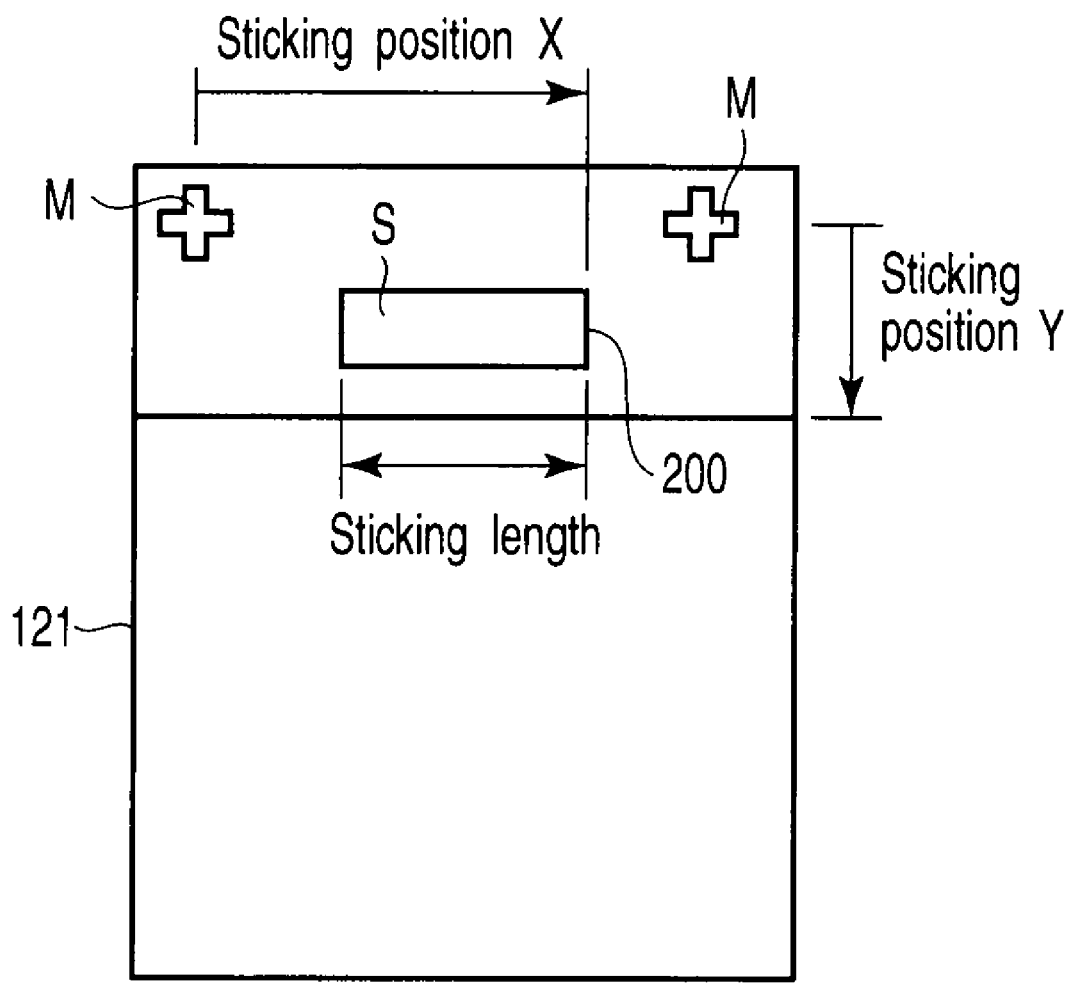
F I G. 1 0

BONDING AGENT STICKING INSPECTION APPARATUS, MOUNTING APPARATUS, AND METHOD OF MANUFACTURING ELECTRICAL COMPONENT

CROSS-REFERENCE TO RELATED APPLICATIONS

This application is based upon and claims the benefit of priority from prior Japanese Patent Application No. 2007-238446, filed Sep. 13, 2007, the entire contents of which are incorporated herein by reference.

BACKGROUND OF THE INVENTION

1. Field of the Invention

The present invention relates to a bonding agent sticking inspection apparatus for inspecting a sticking state of a bonding agent such as an anisotropic conductive film stuck on a glass substrate of, for example, a liquid crystal panel. Further, the present invention relates to a mounting apparatus provided with a bonding agent sticking inspection apparatus for inspecting a sticking state of a bonding agent such as an anisotropic conductive film stuck on a glass substrate of, for example, a liquid crystal panel. Furthermore, the present invention relates to a method of manufacturing an electrical component including a bonding agent sticking inspection step for inspecting a sticking state of a bonding agent such as an anisotropic conductive film stuck on a glass substrate of, for example, a liquid crystal panel.

2. Description of the Related Art

On an electronic component such as a liquid crystal panel, a semiconductor chip, and a flexible substrate are mounted by a mounting system provided with a plurality of units for performing various types of processing.

The mounting system is provided with a unit for supplying a liquid crystal panel, a unit for mounting a semiconductor chip on the liquid crystal panel, a unit for mounting a flexible substrate on the liquid crystal panel on which the semiconductor chip is mounted, a unit for collecting the liquid crystal panel subjected to the various mounting operations, and the like. The liquid crystal panel is successively sent to the unit for supplying a semiconductor chip, the unit for supplying a flexible substrate, and the unit for collecting the liquid crystal panel, and is subjected to the various operations.

Each of the unit for mounting a semiconductor chip on the liquid crystal panel, and the unit for mounting a flexible substrate on the liquid crystal panel is provided with a mounting apparatus for mounting each component on the liquid crystal panel. The mounting apparatus is provided with a bonding agent sticking apparatus for sticking a bonding agent such as an anisotropic conductive film on an electrode of the liquid crystal panel, a pressure bonding apparatus for pressure-bonding the semiconductor chip and the flexible substrate to the bonding agent, and the like. The bonding agent is interposed between the electrode and the semiconductor chip, and between the electrode and the flexible substrate in order that the electrode and the semiconductor chip, and the electrode and the flexible substrate may be electrically connected to each other.

The bonding agent is put on a base tape having no adhesion, and wound into a reel-like shape to be held. A necessary length of the bonding agent is cut from the reel, stuck on the liquid crystal panel, and thereafter the base tape is peeled off.

If any shortage of the bonding agent is caused, at the part in which a shortage of the bonding agent is caused, no bonding agent is interposed between the electrode of the liquid crystal panel and the semiconductor chip, or between the electrode and the flexible substrate. Particularly, when the base tape is removed after the bonding agent is stuck on the liquid crystal pane, the peripheral edge part of the bonding agent is liable to be chipped off.

When no bonding agent is interposed between the electrode and the semiconductor chip, or between the electrode and the flexible substrate, the electrical connection at these parts is liable to be canceled. It is not desirable that a nick of such a size that the electrical connection is hindered is formed in the bonding agent.

For this reason, a mounting apparatus for mounting a semiconductor chip or a flexible substrate is provided with an inspection apparatus for inspecting whether or the nick caused in the bonding agent has a size that causes a hindrance. An inspection for checking whether or not the size of the nick of the bonding agent is within a normal range is carried out by using the inspection apparatus before the semiconductor or the flexible substrate is mounted on the liquid crystal panel.

An inspection apparatus of such a type is provided with a camera. A picture of a range of a glass substrate in which the bonding agent must be positioned is taken by the camera. When a nick is present in the bonding agent, the luminance in the photographed image at the part in which the nick is present is different from that of the part in which the bonding agent is normally stuck.

The inspection apparatus divides the luminance components of the parts in the photographed image into those of abnormal parts (parts in which a nick or the like is present) and those of normal parts by using a threshold. Further, the inspection apparatus performs binarization processing in which, for example, normal parts are blackened, and parts in which a nick is present are whitened. The inspection apparatus judges whether or not a nick formed in the bonding agent is within a normal range by detecting the number of pixels of the abnormal part, and comparing the total number of pixels of the abnormal part with a threshold.

The bonding agent is cut when it is stuck, and the base tape is peeled off from the cut end part of the bonding agent, and hence a nick is liable to occur at the end part. Thus, when the bonding agent is inspected, inspecting only both end parts of the bonding agent has been performed.

However, it can be considered that a nick may occur at parts other than the both end parts, and hence inspecting the entire bonding agent is performed. A technique of such a type is disclosed in, for example, Jpn. Pat. Appln. KOKAI Publication No. 2001-21333.

On the other hand, a nick formed in a bonding agent stuck on the liquid crystal panel has, even when the nick has a size larger than the threshold, a shape that hinders the electrical connection or a shape that does not hinder the electrical connection. This point will be specifically described below.

A plurality of electrodes are formed on the liquid crystal panel, and are arranged side by side with each other in one direction. Accordingly, when the nick is extended in the direction in which the plural electrodes are arranged, and a part overlapping the nick is small in each electrode, the electrical connection is not hindered in some cases even if the size of the nick is larger than the threshold.

Conversely, when the size of the nick is larger than the threshold, and the nick has a shape overlapping, for example, an electrode, it becomes impossible for the electrode to be connected to the semiconductor chip or the flexible substrate. In this case, the electrical connection between the electrode and the semiconductor chip, and the electrical connection between the electrode and the flexible substrate are hindered.

In the inspection apparatus and the inspection method disclosed in Jpn. Pat. Appln. KOKAI Publication No. 2001-21333, an abnormality in the stuck bonding agent is judged by the total number of pixels indicating the nick. Thus, as described above, it is considered that even when a shape of the nick is a shape that does not hinder the electrical connection, it may possibly be judged that there is an abnormality in the bonding agent.

It is therefore not desirable that the bonding agent be judged as abnormal if the nick does not hinder the electrical connection.

BRIEF SUMMARY OF THE INVENTION

An object of the present invention is to provide a bonding agent sticking inspection apparatus capable of accurately judging a nick of a bonding agent which hinders the electrical connection. Another object of the present invention is to provide a mounting apparatus including a bonding agent sticking inspection apparatus capable of accurately judging a nick of a bonding agent which hinders the electrical connection. Still another object of the present invention is to provide a method of manufacturing an electrical component capable of accurately judging a nick of a bonding agent which hinders the electrical connection.

A bonding agent sticking inspection apparatus according to an aspect of the present invention comprises a photographing section, a movement section, and a control section. The photographing section photographs an image which includes a sticking expected range indicating a range in which a bonding agent to be interposed between the electrodes and a component to be electrically connected to the electrodes should be positioned. The sticking expected range is a range in which a bonding agent to be interposed between the electrodes and a component to be electrically connected to the electrodes should be positioned. The movement section guides the substrate into a visual field of the photographing section. The control section controls the photographing section and the movement section in order to photograph an entire region of the sticking expected range. Further, the control section sets an inspection region having a width equal to the pitch between electrodes in an entire edge part in a direction in which the electrodes are arranged in a peripheral edge part of the sticking expected range in the image photographed by the photographing section, detects a ratio of a nicked part of the bonding agent to the inspection region, and judges whether or not an abnormality is present in the bonding agent on the basis of a comparison between the ratio of the nicked part and a threshold set in advance.

A mounting apparatus according to another aspect of the invention comprises a bonding agent sticking section, a bonding agent sticking inspection section, and an attaching section. The bonding agent sticking section sticks a bonding agent on a plurality of electrodes arranged on a substrate at predetermined pitches between electrodes. The bonding agent sticking inspection section inspects a stuck state of the bonding agent. The attaching section attaches a component to be connected with the bonding agent interposed between the substrate and the component.

The bonding agent sticking inspection section includes a photographing section, a movement section, and a control section. The photographing section photographs an image of a substrate in such a manner that the image includes a sticking expected range. The sticking expected range is a range in which a bonding agent to be interposed between the electrodes and a component to be electrically connected to the electrodes should be positioned. The movement section guides the substrate into a visual field of the photographing section. The control section controls the photographing section and the movement section in order to photograph an entire region of the sticking expected range. Further, the control section sets an inspection region having a width equal to the pitch between electrodes in an entire edge part in a direction in which the electrodes are arranged in a peripheral edge part of the sticking expected range in the image photographed by the photographing section, detects a ratio of a nicked part of the bonding agent to the inspection region, and judges whether or not an abnormality is present in the bonding agent on the basis of a comparison between the ratio of the nicked part and a threshold set in advance.

A method of manufacturing an electrical component according to another aspect of the invention comprises bonding agent sticking inspection steps. In the bonding agent sticking inspection steps, an entire region of a sticking expected range set in such a manner that the sticking expected range includes a range in which a plurality of electrodes are arranged on a substrate, and indicating a range in which a bonding agent should be positioned is photographed, an inspection region having a width equal to the pitch between electrodes is set in an entire range in a direction in which the electrodes are arranged in a peripheral edge part of the sticking expected range in the photographed image, parts having the bonding agent and parts having no bonding agent in the inspection region are discriminated from each other on the basis of a comparison with a threshold set in advance, a ratio of the parts having no bonding agent to the inspection region is detected, and it is judged that there is a nick in the inspection region on the basis of a comparison between the ratio of the parts having no bonding agent and a threshold set in advance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3A is a schematic view showing a step of mounting a semiconductor chip on a liquid crystal panel in the mounting apparatus shown in FIG. 2.

FIG. 3B is a schematic view showing a step of mounting the semiconductor chip on the liquid crystal panel in the mounting apparatus shown in FIG. 2.

FIG. 3C is a schematic view showing a step of mounting the semiconductor chip on the liquid crystal panel in the mounting apparatus shown in FIG. 2.

FIG. 3D is a schematic view showing a step of mounting the semiconductor chip on the liquid crystal panel in the mounting apparatus shown in FIG. 2.

FIG. 3E is a schematic view showing a step of mounting the semiconductor chip on the liquid crystal panel in the mounting apparatus shown in FIG. 2.

FIG. 5A is a perspective view showing the configuration of a pre-alignment apparatus shown in FIG. 2.

FIG. 5B is a plan view showing reference marks provided on the liquid crystal panel shown in FIG. 4.

FIG. 6 is a side view for explaining a substrate height measurement step of the pre-alignment apparatus shown in FIG. 5A.

FIG. 8 is a side view for schematically explaining a step of sticking an anisotropic conductive film in a bonding agent sticking apparatus shown in FIG. 2.

FIG. 9 is a perspective view showing the rear side of the mounting apparatus shown in FIG. 2.

FIG. 10 is a plan view showing a range on the liquid crystal panel shown in FIG. 4 in which sticking is to be performed.

DETAILED DESCRIPTION OF THE INVENTION

Figure 1:
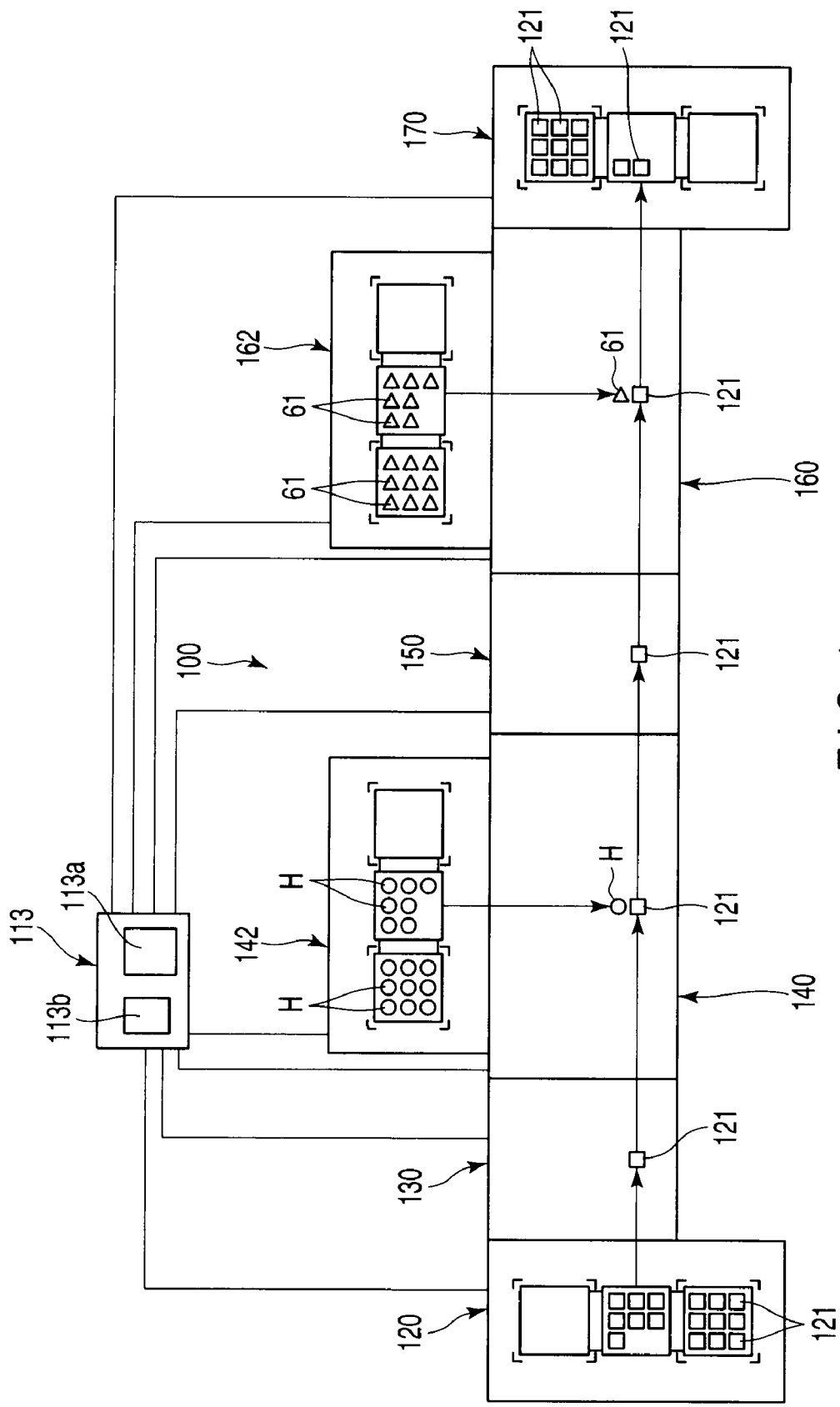
FIG. 1 is a plan view showing an outline of a mounting system provided with a mounting apparatus according to an embodiment of the present invention.

A mounting apparatus 110 according to an embodiment of the present invention will be described below with reference to FIGS. 1 to 19. FIG. 1 is a schematic view showing a mounting system 100 for mounting a semiconductor chip H or a flexible substrate 61 on a liquid crystal panel 121.

As shown in FIG. 1, the mounting system 100 is provided with a liquid crystal panel supply unit 120 for supplying a liquid crystal panel 121, a washing unit 130 for washing the liquid crystal panel 121, an IC mounting unit 140 for mounting a semiconductor chip H on the liquid crystal panel 121, a buffer unit 150, an FPC mounting unit 160 for mounting a flexible substrate 61 on the liquid crystal panel 121, an IC supply unit 142 for supplying a semiconductor chip H to the IC mounting unit 140, an FPC supply unit 162 for supplying a flexible substrate 61 to the FPC mounting unit 160, a liquid crystal panel collection unit 170 for collecting the liquid crystal panel 121 which has been subjected to the various types of processing, and a control apparatus 113.

Incidentally, the liquid crystal panel 121 is an example of a substrate mentioned in the present invention. The semiconductor chip H and the flexible substrate 61 are examples of a member to be connected mentioned in the present invention.

The liquid crystal panel supply unit 120 is arranged on the left side of FIG. 1. The washing unit 130, IC mounting unit 140, buffer unit 150, FPC mounting unit 160, and liquid crystal panel collection unit 170 are arranged in the order mentioned from the liquid crystal panel supply unit 120 toward the right side. The IC supply unit 142 is arranged on the lateral side (on the upper side of the IC mounting unit 140 in FIG. 1) of the IC mounting unit 140. The FPC supply unit 162 is arranged on the lateral side (on the upper side of the FPC mounting unit 160 in FIG. 1) of the FPC mounting unit 160.

The washing unit 130 washes a liquid crystal panel 121 supplied from the liquid crystal panel supply unit 120. The IC mounting unit 140 mounts a semiconductor chip H supplied from the IC supply unit 142 on the liquid crystal panel 121 washed by the washing unit 130.

The buffer unit 150 retains therein the liquid crystal panel 121 on which the semiconductor chip H is mounted by the IC mounting unit 140 until a processing point of the FPC mounting unit 160 becomes empty. Further, when a processing point of the FPC mounting unit becomes empty, the buffer unit 150 places, in sequence, the liquid crystal panel 121 into the FPC mounting unit 160.

The FPC mounting unit 160 mounts a flexible substrate 61 supplied from the FPC supply unit 162 on the liquid crystal panel 121 passed through the buffer unit 150. The liquid crystal panel collection unit 170 collects the liquid crystal panel 121 on which the flexible substrate 61 is mounted. The control apparatus 113 is connected to each of the units 120 to 170, and controls each of the units 120 to 170.

In each of the IC mounting unit 140 and the FPC mounting unit 160, a mounting apparatus 110 of the present invention is used. The mounting apparatuses 110 used in the IC mounting unit 140 and the FPC mounting unit 160 may have substantially the same structure, and hence the mounting apparatus 110 used in the IC mounting unit 140 will be described below as a representative.

Figure 2:
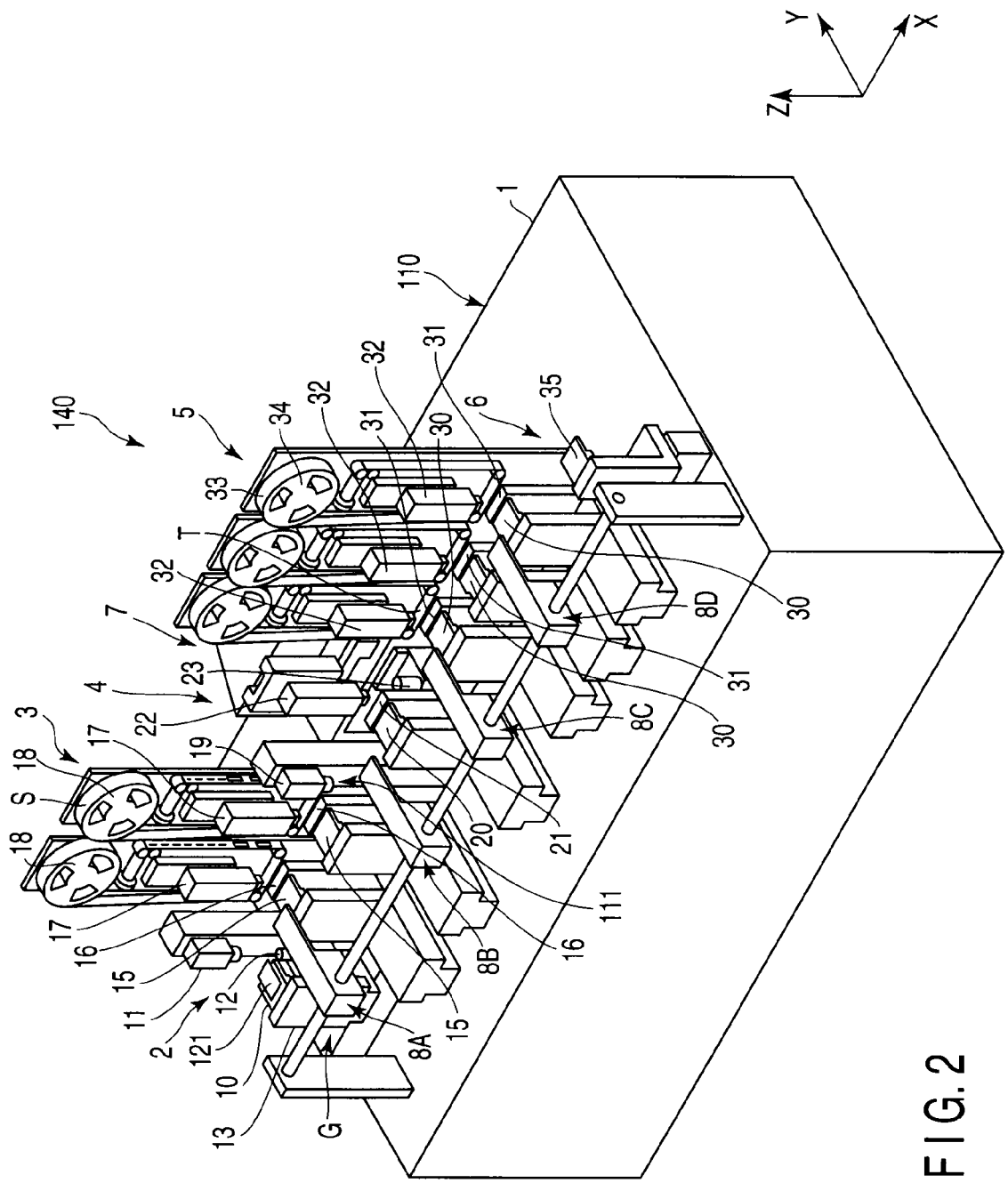
FIG. 2 is a perspective view showing an IC mounting unit shown in FIG. 1.

FIG. 2 is a perspective view showing the IC mounting unit 140. As shown in FIG. 2, the IC mounting unit 140 is provided with the mounting apparatus 110.

The mounting apparatus 110 is provided with a base 1, a pre-alignment apparatus 2, a bonding agent sticking apparatus 3, a bonding agent sticking inspection apparatus 111, a temporary pressure bonding apparatus 4, a regular pressure bonding apparatus 5, a discharging apparatus 6, first to fourth conveyance mechanisms 8A to 8D, and an IC conveyance apparatus 7. Incidentally, the apparatuses 2, 3, 111, 4, 5, 6, 7, and 8A to 8D included in the mounting apparatus 110 are controlled by the control apparatus 113. Accordingly, the control apparatus 113 is a constituent part of the apparatuses 2, 3, 111, 4, 5, 6, 7, and 8A to 8D.

Incidentally, the bonding agent sticking apparatus 3 is an example of the bonding agent sticking section mentioned in the present invention. The bonding agent sticking inspection apparatus 111 is an example of the bonding agent sticking inspection section mentioned in the present invention. The temporary pressure bonding apparatus 4 and the regular pressure bonding apparatus 5 constitute an example of the attaching section mentioned in the present invention.

These pre-alignment apparatus 2, bonding agent sticking apparatus 3, bonding agent sticking inspection apparatus 111, temporary pressure bonding apparatus 4, regular pressure bonding apparatus 5, discharging apparatus 6, IC conveyance apparatus 7, and first to fourth conveyance mechanisms 8A to 8D are arranged on the base 1, and are arranged in sequence from the left side end to the right side end at predetermined intervals, in FIG. 2.

Here, the direction in which the pre-alignment apparatus 2, bonding agent sticking apparatus 3, temporary pressure bonding apparatus 4, regular pressure bonding apparatus 5, and discharging apparatus 6 are arranged is set as the X direction. The direction (depth direction) intersecting the X direction on the plane is set as the Y direction. The height direction is set as the Z direction.

Incidentally, the washing unit 130 is positioned on the left inner side (not shown) of the IC mounting unit 140 in FIG. 2. The buffer unit 150 is positioned on the right inner side (not shown). The IC supply unit 142 is arranged on the inner side of the temporary pressure bonding apparatus 4. The IC supply unit 142 and the temporary pressure bonding apparatus 4 are aligned with each other in the Y direction.

The first conveyance mechanism 8A is provided to be interposed between the pre-alignment apparatus 2 and the bonding agent sticking apparatus 3. The second conveyance mechanism 8B is provided to be interposed between the bonding agent sticking apparatus 3 and the temporary pressure bonding apparatus 4. The third conveyance mechanism 8C is provided to be interposed between the temporary pressure bonding apparatus 4 and the regular pressure bonding apparatus 5. The fourth conveyance mechanism 8D is provided to be interposed between the regular pressure bonding apparatus 5 and the discharging apparatus 6.

The pre-alignment apparatus 2 is provided with a first stage 10 for supporting the liquid crystal panel 121 supplied from the washing unit 130 in the manner to be described later, a recognition camera 11 for taking an image of the liquid crystal panel 121 on the first stage 10, a laser displacement gauge 12 for measuring a height (distance) from a reference position to the liquid crystal panel 121 on the first stage 10, and a drive mechanism 13 for making the first stage 10 freely movable in the X-Y directions and Z direction, and freely movable in the rotational direction (θ direction) in the horizontal plane.

The recognition camera 11, an image capturing apparatus 113a (shown in FIG. 1) which is provided in the control apparatus 113, and captures and recognizes an imaged image signal of the recognition camera 11, and the drive mechanism 13 which receives a recognition signal from the image capturing apparatus 113a, and is drive-controlled in the predetermined direction constitute a position correction mechanism G.

Incidentally, various sensors such as a noncontact optical sensor provided with an autofocus function, an optical sensor using infrared rays, and a mechanical contact sensor may be used as a substitute for the laser displacement gauge 12.

FIGS. 3A to 3E are views each showing a step of mounting a semiconductor chip H on the liquid crystal panel 121. FIG. 3A shows the configuration of the liquid crystal panel 121. As shown in FIG. 3A, the liquid crystal panel 121 supplied from a unit (washing unit 130 in this embodiment) arranged on the upstream side to the pre-alignment apparatus 2 of the mounting apparatus 110 of the IC mounting unit 140 is provided with two glass plates, a1 and a2, formed into a rectangular shape in a plan view, and polarizing plates b1 and b2 adhered to the front and back surfaces of the glass plates. An electrode (not shown) is formed between the glass plates a1 and a2, and a liquid crystal material is interposed between the glass plates a1 and a2.

Although end edges of three sides of each of the glass plates a1 and a2, and the polarizing plates b1 and b2 are made flush with each other, only one side part of the glass plate a2 is protruded from the end edges of the other glass plate a1 and the polarizing plates b1 and b2. Electrodes are formed on one surface (top surface in this case) of the protruded part of the glass plate a2.

Figure 4:
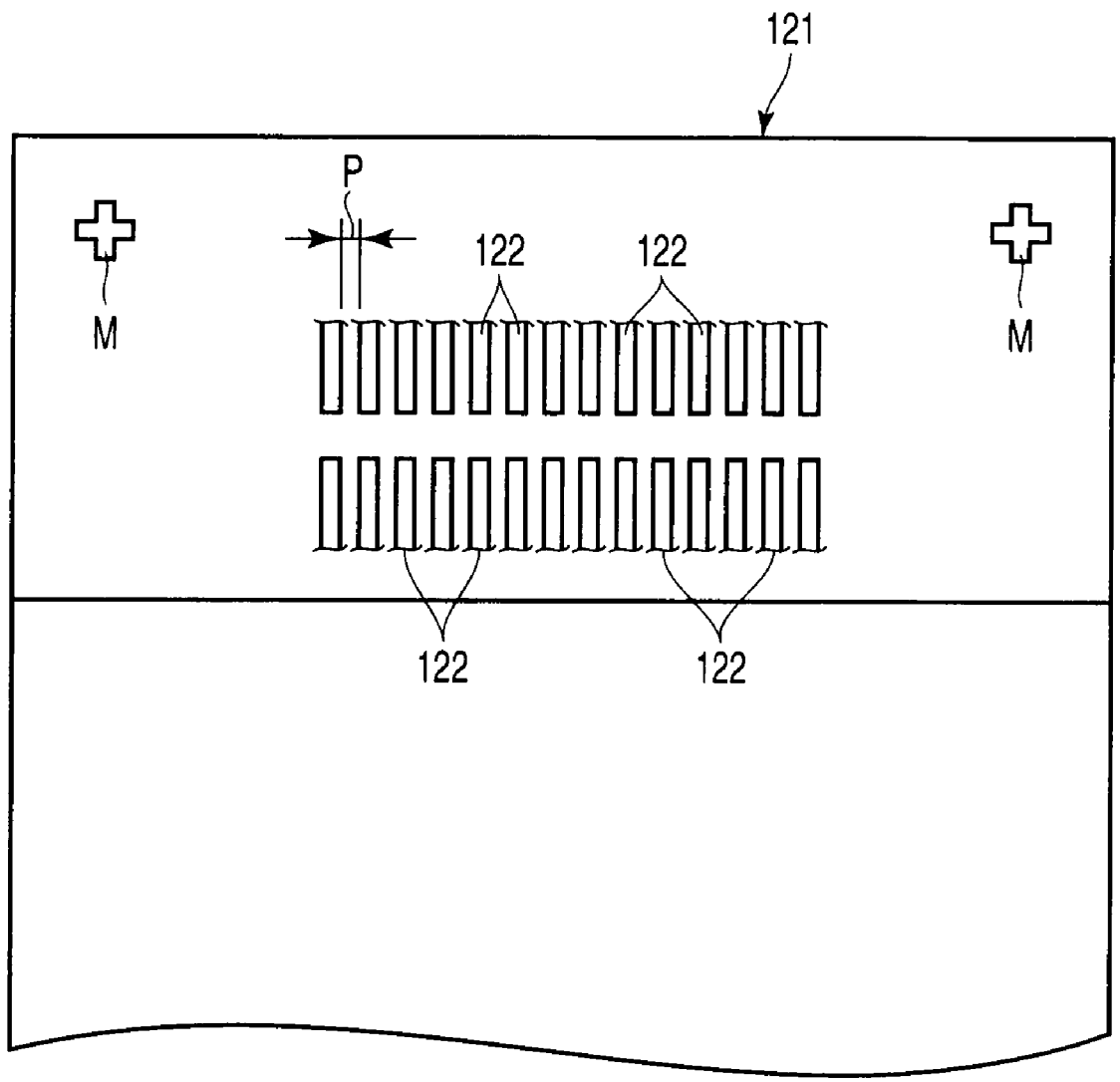
FIG. 4 is a plan view showing a part in the glass plate shown in FIGS. 3A to 3E at which electrodes exposed to the outside are provided in an enlarged manner.
Figure 7:
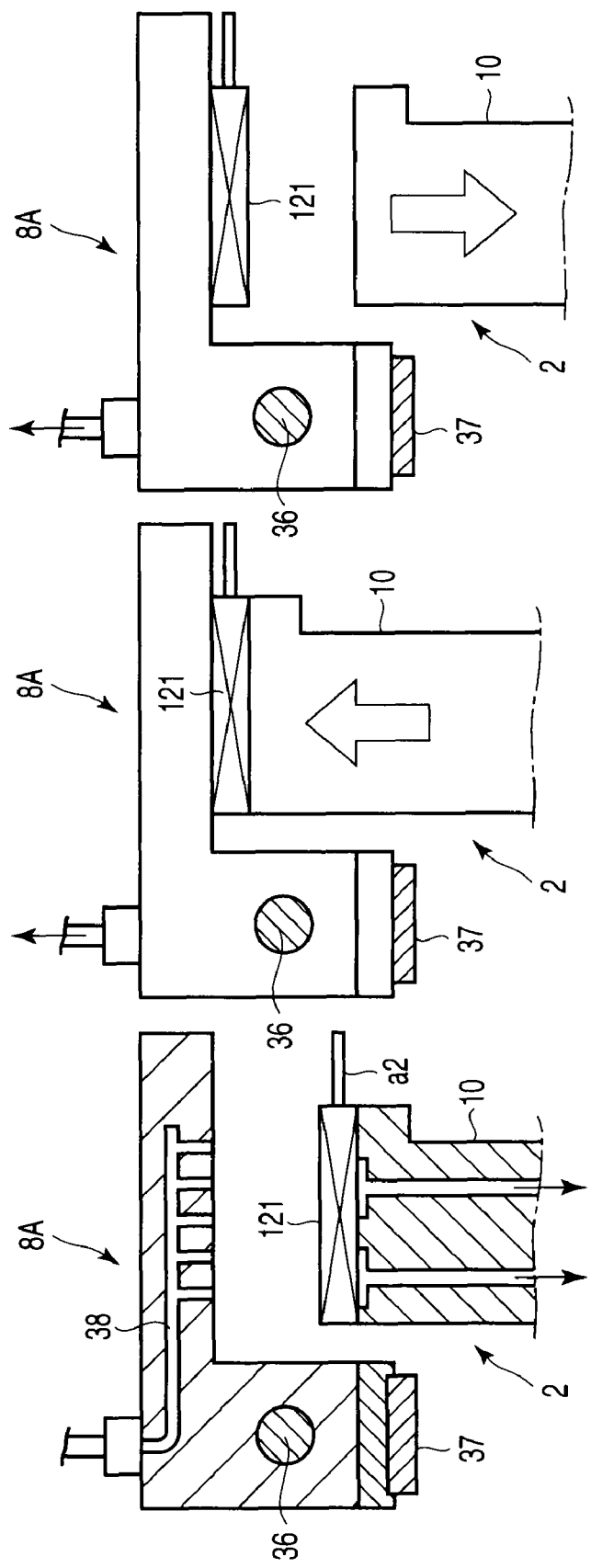
FIG. 7A is a schematic view for explaining in sequence a function in which a liquid crystal panel is transferred from a first stage of the pre-alignment apparatus to a first conveyance mechanism shown in FIG. 2.
FIG. 7B is a schematic view for explaining in sequence the function in which the liquid crystal panel is transferred from the first stage of the pre-alignment apparatus to the first conveyance mechanism shown in FIG. 2.
FIG. 7C is a schematic view for explaining in sequence the function in which the liquid crystal panel is transferred from the first stage of the pre-alignment apparatus to the first conveyance mechanism shown in FIG. 2.

FIG. 4 is a plan view showing the part of the glass plate a2 at which electrodes 122 exposed to the outside are provided in an enlarging manner. FIG. 4 shows a part of the electrodes 122. As shown in FIG. 4, plural electrodes are used, and form two groups separated in the Y direction at the time when the liquid crystal panel 121 is set on the first stage 10. In each group, the electrodes 122 are arranged in the X direction at predetermined intervals of, for example, 0.2 mm. That is, the pitch P between electrodes is 0.2 mm. Incidentally, in FIG. 4, the electrodes 122 are depicted enlarged in an exaggerated fashion. An anisotropic conductive film S, which is an example of the bonding agent, is stuck on the electrodes 122 in the manner to be described later. The semiconductor chip H is mounted through the anisotropic conductive film S.

The anisotropic conductive film S is formed into a tape-like shape. The anisotropic conductive film S is a connection material having three functional characteristics of adhesion, conduction, and insulation. The anisotropic conductive film S is a high-polymer film having electrical anisotropy in which conductivity is given in the thickness direction of the film, and insulation characteristics are given in the surface direction by pressure bonding the film in a heated state. Incidentally, the anisotropic conductive film S is an example of the bonding material mentioned in the present invention. However, the example is not limited to this.

As shown in FIG. 2, the bonding agent sticking apparatus 3 is provided with two sticking stages 15 juxtaposed with each other in the X direction, two backup stages 16, two sticking heads 17, and two bonding agent supply mechanisms 18.

The sticking stage 15 holds the liquid crystal panel 121 by sucking it, and can be freely movable in the X, Y, and Z directions. The backup stage 16 is provided on the sticking stage 15, and is moved in the Y direction together with the sticking stage 15.

The sticking head 17 is provided at a position directly above the backup stage 16. The sticking head 17 is supported so as to be freely ascended or descended in the Z direction in such a manner that the head 17 acts on the backup stage 16 with a predetermined heating temperature and predetermined pressing force. The bonding agent supply mechanism 18 supplies the tape-like anisotropic conductive film S wound on a reel to a part between the backup stage 16 and the sticking head 17.

The bonding agent sticking inspection apparatus 111 is provided with the second conveyance mechanism 8B, the bonding agent recognition camera 19, and the control apparatus 113. The bonding agent sticking inspection apparatus 111 detects, as will be described later, a nick of the anisotropic conductive film S, and judges whether or not there is any abnormality in the anisotropic conductive film S on the basis of a size of the nick. The bonding agent recognition camera 19 is arranged between the bonding agent sticking inspection apparatus 111 and the temporary pressure bonding apparatus 4.

Incidentally, the second conveyance mechanism 8B is an example of the transfer section mentioned in the present invention. The bonding agent recognition camera 19 is an example of the photographing section mentioned in the present invention. The control apparatus 113 is an example of the control section mentioned in the present invention.

The temporary pressure bonding apparatus 4 is provided with a single temporary pressure bonding stage 20, a backup stage 21 provided at a position in the vicinity of the temporary pressure bonding stage 20, and a temporary pressure bonding head 22 and a recognition camera 23.

The temporary pressure bonding stage 20 holds the liquid crystal panel 121 by sucking it. The temporary pressure bonding stage 20 is provided with a drive mechanism freely movable in the X, Y, and Z directions, and freely movable in the rotational direction (θ direction) in the horizontal plane. The backup stage 21 is provided at a position in the vicinity of the temporary pressure bonding stage 20, and is fixed, i.e., not movable in any direction.

The temporary pressure bonding head 22 is provided at a position directly above the backup stage 21. The temporary pressure bonding head 22 is freely movable in the X direction, Y direction, and θ direction. The temporary pressure bonding head 22 is supported so as to be freely ascended or descended in the Z direction in such a manner that the head 22 acts on the backup stage 21 with a predetermined heating temperature and predetermined pressing force.

The recognition camera 23 performs recognition of the liquid crystal panel 121 transferred to the temporary pressure bonding stage 20, and recognition of the semiconductor chip H supplied from the IC conveyance apparatus 7 to be described later. Further, the recognition camera 23 is provided with a function of allowing the semiconductor chip H to be accurately mounted on the mounting position of the liquid crystal panel 121 by correcting the misregistration on the basis of the recognition results (results of recognition of the liquid crystal panel 121, and recognition of the semiconductor chip H).

Figure 17A:
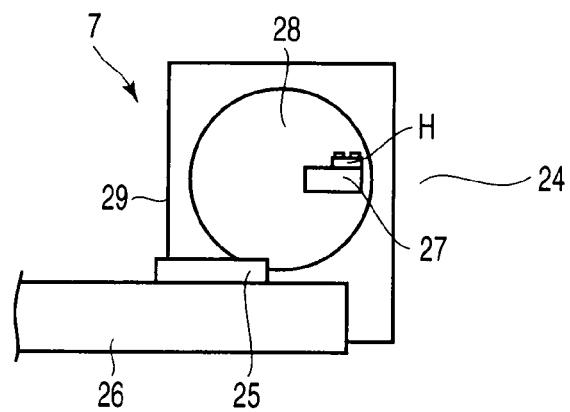
FIG. 17A is a schematic view showing in sequence a function of an IC conveyance apparatus shown in FIG. 9.
Figure 17B:
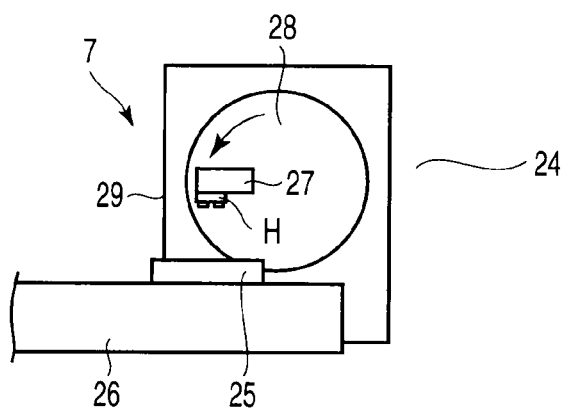
FIG. 17B is a schematic view showing in sequence the function of the IC conveyance apparatus shown in FIG. 9.
Figure 17C:
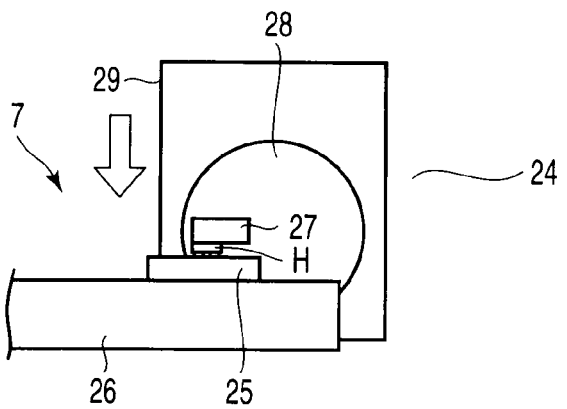
FIG. 17C is a schematic view showing in sequence the function of the IC conveyance apparatus shown in FIG. 9.

The IC conveyance apparatus 7 is shown in FIGS. 9, and 17A to 17C. FIG. 9 is a perspective view showing the rear side of the mounting apparatus 110. FIGS. 17A to 17C are views showing in sequence the function of the IC conveyance apparatus 7.

The IC conveyance apparatus 7 receives a semiconductor chip H from the IC supply unit 142, and conveys the semiconductor chip H to the temporary pressure bonding apparatus 4. The IC conveyance apparatus 7 is provided with a chip inversion mechanism 24, a chip stage 25, and a chip conveyance mechanism 26.

The chip inversion mechanism 24 is constituted of a suction/attraction section 27 for receiving a semiconductor chip H in a state where the chip H is provided with a bump on the top surface thereof, and holding the chip H by sucking it, a half rotation mechanism 28 for inverting the posture of the semiconductor chip H upside down by rotating the suction/attraction section 27 by 180°, and an elevator mechanism 29 for ascent/descent-driving the half rotation mechanism 28 together with the suction/attraction section 27.

The chip stage 25 receives the semiconductor chip H from the chip inversion mechanism 24, and supports the chip H by sucking it. The chip conveyance mechanism 26 conveys the chip stage 25 to the temporary pressure bonding apparatus 4, and conveys the semiconductor chip H supported by the chip stage 25 to a position opposed to the temporary pressure bonding head 22.

Incidentally, the chip stage 25 and the chip conveyance mechanism 16 are not necessarily limited to receiving the semiconductor chip H through the chip inversion mechanism 24. The chip stage 25 and the chip conveyance mechanism 26 can directly receive the semiconductor chip H or other electronic component, and can covey the chip H or the component to the temporary pressure bonding apparatus 4 by omitting the chip inversion mechanism 24.

As shown in FIG. 2, the regular pressure bonding apparatus 5 is provided with three regular pressure bonding stages 30 juxtaposed in the X direction, a backup stage 31 arranged at a position in the vicinity of the regular pressure bonding stage 30, three regular pressure bonding heads 32 provided to be opposed to the backup stage 31, and a protective tape supply mechanism 33 for supplying a protective tape T. Incidentally, in this embodiment, although three regular pressure bonding stages 30 are used, the present invention is not limited to this.

The regular pressure bonding stage 30 holds the liquid crystal panel 121 by sucking it, and is freely movable in the X, Y, and Z directions. The backup stage 31 is provided at a position in the vicinity of the regular pressure bonding stage 30, and fixed without being moved in any direction. The regular pressure bonding head 32 is provided at a position directly above the backup stage 31, and is supported so as to be freely ascended or descended in the Z direction in such a manner that the head 32 acts on the backup stage 31 with a predetermined heating temperature and predetermined pressing force.

The protective tape T unreeled from the supply reel 34 in the protective tape supply mechanism 33 is interposed between the regular pressure bonding head 32 and the semiconductor chip H when the regular pressure bonding head 32 acts on the semiconductor chip H.

The discharging apparatus 6 is installed on the downstream side of the regular pressure bonding apparatus 5 in the X direction. The discharging apparatus 6 is provided with a discharging stage 35. The discharging stage 35 receives the liquid crystal panel 121 on which the semiconductor chip H is mounted and which is transferred from the regular pressure bonding apparatus 5. This discharging stage 35 is moved in the X direction to a transfer position at which transfer is performed between the stage 35 and a unit (not shown) (buffer unit 150 in this embodiment) on the downstream side, and the liquid crystal panel 121 can be transferred to the downstream apparatus.

In the mounting apparatus 110 configured in the manner described above, the liquid crystal panel 121 shown in FIG. 3A is supplied from the upstream unit (washing unit 130 in this embodiment) to the pre-alignment apparatus 2.

In the pre-alignment apparatus 2, a step of subjecting the liquid crystal panel 121 to position correction is performed in a manner to be described later. Subsequently, as shown in FIG. 3B, in the bonding agent sticking apparatus 3, a bonding agent sticking step of sticking the anisotropic conductive film S on the protruded part of the glass plate a2 is performed. Subsequently, as shown in FIG. 3C, in the bonding agent sticking inspection apparatus 111, a bonding agent inspection step of inspecting the stuck state of the anisotropic conductive film S is performed.

Subsequently, as shown in FIG. 3D, in the temporary pressure bonding apparatus 4, a temporary pressure bonding step of positioning the semiconductor chip H, which is an electronic component, with respect to the anisotropic conductive film S bonded to the liquid crystal panel 121, and temporarily bonding the semiconductor chip H to the anisotropic conductive film S by applying pressure to the chip H is performed. Subsequently, as shown in FIG. 3E, in the regular pressure bonding apparatus 5, a regular pressure bonding step of regularly bonding the semiconductor chip H to the liquid crystal panel 121 to thereby mount the semiconductor chip H on the liquid crystal panel 121 is performed. Thereafter, the liquid crystal panel 121 is transferred from the discharging apparatus 6 to the downstream unit.

Incidentally, the mounting apparatus 110 is configured to include a pre-alignment apparatus 2, two bonding agent sticking apparatuses 3, a bonding agent sticking inspection apparatus 111, a temporary pressure bonding apparatus 4, three regular pressure bonding apparatuses 5, and a discharging apparatus 6. This is because setting is performed by using the required time of the temporary pressure bonding step in the temporary pressure bonding apparatus 4 as a reference.

That is, when the temporary pressure bonding step requires five seconds, in order to perform the bonding agent sticking step requiring ten seconds at two positions, two bonding agent sticking apparatuses 3 are provided, in order to perform the regular pressure bonding step requiring fifteen seconds at three positions, three regular pressure bonding apparatuses 5 are provided, thereby making it possible to make the optimum tact time five seconds. In this manner, the productivity is enhanced.

An operation of the mounting apparatus 110 for mounting an electronic component will be described below in detail.

FIG. 5A is a perspective view showing the schematic configuration of the pre-alignment apparatus 2. FIG. 5B is a plan view showing reference marks M provided on the liquid crystal panel 121. FIG. 6 is a side view for explaining a substrate height measurement step of the pre-alignment apparatus 2.

The liquid crystal panel 121 having the configuration shown in FIG. 3A is supplied from an upstream unit (the washing unit 130 in this case) to the first stage 10 of the pre-alignment apparatus 2. The state of the liquid crystal panel 121 at this time is that in which the electrodes 122 are arranged in the X direction. Further, the misregistration of the liquid crystal panel 121 caused when the panel 121 is transferred is corrected in the pre-alignment apparatus 2 by the function of the position correction mechanism G.

That is, the liquid crystal panel 121 is transferred from the washing unit 130, and placed on the first stage 10 of the pre-alignment apparatus 2. Further, a suction/attraction mechanism is activated at a proper timing, and the liquid crystal panel 121 is fixed to the top surface of the first stage 10 by vacuum suction/attraction.

In this state, the end edges of the glass plate a1 having no protruded part, and the two polarizing plates b1 and b2 all of which are constituents of the liquid crystal panel 121 are substantially flush with the leading end edge of the first stage 10, and the protruded part of the glass plate a2 protrudes from the end edge of the first stage 10.

As shown in FIG. 5B, two reference marks M are formed in advance on the right and left sides of the liquid crystal panel 121. When the conveyance direction (X direction toward the downstream side) of the liquid crystal panel 121 is the direction indicated by an arrow in FIG. 5B, the recognition camera 11 first takes an image of the reference mark M on the right side (one of both sides to be arranged forward in the direction of travel of the liquid crystal panel 121).

Subsequently, the drive mechanism 13 provided in the first stage 10 is operated, and the liquid crystal panel 121 is moved in the X direction by a predetermined amount together with the stage. The drive mechanism 13 is stopped in a state where the reference mark M on the left side is positioned at a part below the recognition camera 11, and the recognition camera 11 takes an image of the reference mark M on the left side. The imaging range of the recognition camera 11 is indicated by a hatched circular mark K.

An imaged signal of the reference mark M an image of which is taken by the recognition camera 11 is sent to the control apparatus 113, and is captured in the image capturing apparatus 113a provided in the control apparatus 113. The control apparatus 113 calculates an amount of a difference between the position of the liquid crystal panel 121 fixed to the first stage 10 by suction/attraction and the reference position set in advance on the first stage 10 from these recognition results.

On the basis of the calculation result, the drive mechanism 13 provided in the first stage 10 is operated to move the liquid crystal panel 121 in the horizontal directions (X-Y directions) and the rotational direction (θ direction) in the horizontal plane. As a result of this, the misregistration of the liquid crystal panel 121 caused when the panel 121 is transferred from the washing unit 130, which is the upstream unit, can be absorbed, and the position of the liquid crystal panel 121 can be corrected to the reference position previously set on the first stage 10.

As described above, the position of the liquid crystal panel 121 is corrected on the basis of the results of recognizing the reference marks M provided on the liquid crystal panel 121 by means of the recognition camera 11. Accordingly, the positioning accuracy of the liquid crystal panel 121 is not adversely affected by the variation in the peripheral edge shape of the substrate, unlike in the conventional case.

The position of the liquid crystal panel 121 is corrected to the reference position set in advance on the first stage 10, and hence the first conveyance mechanism 8A can receive the liquid crystal panel 121 from the reference position, and can transfer the liquid crystal panel 121 to a reference position previously set on the stage 15 of the bonding agent sticking apparatus 3 provided adjacent to the first stage 10.

As described above, the first to fourth conveyance mechanisms 8A to 8D each convey the liquid crystal panel 121 between two predetermined reference positions of the stages 10, 15, 20, 30, and 35 of the apparatuses 2 to 6.

Accordingly, the position of the liquid crystal panel 121 is corrected to the predetermined reference position on the first stage 10 of the pre-alignment apparatus 2, and hence the receiving position and the transferring position in the second to fourth conveyance mechanisms 8B to 8D are accurately determined. Thus, the steps to be described later are accurately performed, and hence the reliability can be improved.

As shown in FIG. 6, on the first stage 10 of the pre-alignment apparatus 2, a step of correcting the height position of the liquid crystal panel 121 is performed simultaneously with the position correction step of the liquid crystal panel 121.

More specifically, after the recognition camera 11 recognizes the reference marks M provided on the liquid crystal panel 121, the laser displacement gauge 12 provided at a lower part of the pre-alignment apparatus 2 measures the height position of the liquid crystal panel 121.

The laser displacement gauge 12 irradiates the back surface of the protruded part of the glass plate a2 constituting the liquid crystal panel 121 with laser light, and transmits the measurement signal to the control apparatus 113. The control apparatus 113 calculates a distance L1 from a reference position (for example, a top surface of the base 1) to the back surface of the protruded part of the glass plate a2 of the liquid crystal panel 121 on the basis of the measurement signal.

An amount of a difference between the height position of the liquid crystal panel 121 fixed to the first stage 10 by suction/attraction and a reference height position of the liquid crystal panel 121 set in advance is calculated from the above calculation result. Further, the drive mechanism 13 provided in the first stage 10 is operated, and the liquid crystal panel 121 is moved in the height direction (Z direction), thereby making the height position of the liquid crystal panel 121 equal to the reference height position.

This result also corresponds to the liquid crystal panel 121 in each of the subsequent steps to be described later on a one-to-one basis. Further, in each of the apparatuses 3 to 6 to which the liquid crystal panel 121 is conveyed, the height in each of the stages 15, 20, 30, and 35 is corrected in accordance with the measurement result of each liquid crystal panel 121 held in each of the apparatuses 3 to 6 at the point in time, and the heights in all the stages are made coincident with each other. Further, the operation of the height measurement of the liquid crystal panel 121 is completed during the positioning recognition operation of the liquid crystal panel 121, and hence the height measurement operation does not affect the apparatus tact.

When the position correction and the height position control of the liquid crystal panel 121 is completed, the first conveyance mechanism 8A is driven to be moved to the transferring position of the liquid crystal panel 121 corrected to the conveyance reference position of the first stage 10.

FIGS. 7A to 7C are schematic views for explaining in sequence the operation of transferring the liquid crystal panel 121 from the first stage 10 of the pre-alignment apparatus 2 to the first conveyance mechanism 8A.

As shown in FIG. 7A, the first stage 10 of the pre-alignment apparatus 2 is located at a position directly beneath the first conveyance mechanism 8A with the liquid crystal panel 121 being kept fixed thereto by vacuum suction/attraction. The first conveyance mechanism 8A is formed in such a manner that the cross section thereof has a reversed L-shape, a magnet section 36 constituting a linear motor is provided at a proximal end part thereof, and the mechanism 8A is supported by a linear-motion guide 37. Further, a suction/attraction path 38 communicating with an external vacuum source (not shown) is provided in the horizontal cantilever part of the first conveyance mechanism 8A, and the suction/attraction path 38 is opened at the undersurface of the horizontal cantilever part.

As shown in FIG. 7B, the first stage 10 is driven to be elevated and is stopped at a predetermined position. The external vacuum source is driven in a state where the liquid crystal panel 121 is in contact with the first conveyance mechanism 8A, and the liquid crystal panel 121 is attached to the first conveyance mechanism 8A by vacuum suction/attraction.

Subsequently, as shown in FIG. 7C, the vacuum suction/attraction function in the first stage 10 of the pre-alignment apparatus 2 is canceled, and the first stage 10 is driven to be lowered, thereby completing the step of transferring the liquid crystal panel 121 to the first conveyance mechanism 8A. The linear motor mechanism is operated with the first conveyance mechanism 8A holding the liquid crystal panel by vacuum suction/attraction, whereby the first conveyance mechanism 8A is moved in the X direction, and is stopped so as to be opposed to a reference position determined in advance on the sticking stage 15 of the bonding agent sticking apparatus 3.

In this way, the first conveyance mechanism 8A conveys the liquid crystal panel 121 from the first stage 10 of the pre-alignment apparatus 2 to the sticking stage 15 of the bonding agent sticking apparatus 3. Further, the structures of the second to fourth conveyance mechanisms 8B to 8D are the same as the first conveyance mechanism 8A. Further, the function of transferring the liquid crystal panel 121 of each of the second to fourth conveyance mechanisms 8B to 8D for the stages 15, 20, 30, and 35 of the apparatuses 3, 4, 5, and 6 is performed by the same procedures as described previously. Thus, the detailed description of the functions of the second to fourth conveyance mechanisms 8B to 8D will be omitted.

As shown in FIG. 2, the first conveyance mechanism 8A receives the liquid crystal panel 121 from the pre-alignment apparatus 2, holds the panel 121 by suction/attraction, moves in the X direction, and stops when the mechanism 8A reaches a position at which the mechanism 8A is opposed to the bonding agent sticking apparatus 3. One of the two sticking stages 15 provided in the bonding agent sticking apparatus 3 once moves from the inner side of the apparatus to the front side, i.e., in the Y direction, is then driven to be elevated, and the liquid crystal panel 121 is transferred from the first conveyance mechanism 8A to the sticking stage 15. The function of transferring the liquid crystal panel 121 at this time is performed in an opposite manner to that described with reference to FIGS. 7A to 7C.

The first conveyance mechanism 8A returns to the first stage 10 of the pre-alignment apparatus 2, holds a next liquid crystal panel 121 which is newly position-corrected by suction/attraction, and then transfers the liquid crystal panel 121 to the other sticking stage 15 of the bonding agent sticking apparatus 3.

The sticking stage 15 of the bonding agent sticking apparatus 3 to which the liquid crystal panel 121 is fixed by suction/attraction moves in the Y direction in order to travel toward a predetermined bonding agent sticking position. Further, after moving to a position in the vicinity of the backup stage 16 provided in the bonding agent sticking apparatus 3, the sticking stage 15 is lowered.

FIG. 8 is a view for explaining the step of sticking the anisotropic conductive film S in the bonding agent sticking apparatus 3. Like the placing position of the liquid crystal panel 121 on the first stage 10 of the pre-alignment apparatus 2 described previously, in the placing position of the liquid crystal panel 121 on the sticking stage 15 of the bonding agent sticking apparatus 3 too, the liquid crystal panel 121 is fixed to the sticking stage 15 by suction/attraction in a state where only the protruded part of the glass plate a2 constituting the liquid crystal panel 121 protrudes from the end edge of the stage 15, and other end edges of glass plate a1 and the two polarizing plates b1 and b2 are made flush with the end edge positions of the stage 15.

Further, the sticking stage 15 is lowered to a height position at which the back surface of the protruded part of the liquid crystal panel 121 comes in contact with the top surface of the backup stage 16. The lowering amount of the bonding agent sticking stage 15 at this time is controlled on the basis of the result of the measurement performed by the laser displacement gauge 12 with respect to the liquid crystal panel 121 supported on the first stage 10 of the pre-alignment apparatus 2 described previously. Accordingly, the protruded part of the liquid crystal panel 121 is held horizontal at all times, and the top surface of the backup stage 16 and the back surface of the liquid crystal panel 121 are in surface contact with each other in a uniform state.

As shown in FIG. 2, the anisotropic conductive film S is wound on a reel in the form of a tape with a separator put between each layer of the wound film S, and is attached to the bonding agent supply mechanism 18. Further, the anisotropic conductive film S is supplied to the sticking position from the bonding agent supply mechanism 18.

The sticking head 17 is driven to be lowered to a position at which a cut is formed in the anisotropic conductive film S at the sticking length by the half cut unit, a predetermined weight and a predetermined temperature are applied to the film S, and the anisotropic conductive film S is stuck on the liquid crystal panel 121. At this time, the mounting part of the liquid crystal panel 121 is held horizontal, and hence inclination of the liquid crystal panel 121 resulting from the variation in thickness of the polarizing plate b2 stuck on the back surface, and misregistration of the sticking position of the anisotropic conductive film S resulting from distortion/deformation caused at the time of application of pressure are not caused.

As shown in FIG. 9, the separator remaining after the anisotropic conductive film S is stuck is sucked by a suction mechanism 40 to be guided into a disposal box 41 arranged on the rear side of the bonding agent sticking apparatus 3, and is discarded.

As shown in FIG. 2, the liquid crystal panel 121 on which the anisotropic conductive film S is stuck is conveyed to the temporary pressure bonding apparatus 4 by the second conveyance mechanism 8B. At this time, the second conveyance mechanism 8B passes a position opposed to the bonding agent recognition camera 19 of the bonding agent sticking inspection apparatus 111. In other words, the bonding agent recognition camera 19 is arranged above the liquid crystal panel 121 conveyed by the second conveyance mechanism 8B. Further, while the liquid crystal panel 121 is conveyed from the bonding agent sticking apparatus 3 to the temporary pressure bonding apparatus 4, liquid crystal panel 121 is inspected by the bonding agent sticking inspection apparatus 111 as to whether or not any exfoliation or nick is present in the anisotropic conductive film S.

If the liquid crystal panel 121 reaches the temporary pressure bonding apparatus 4 or the regular pressure bonding apparatus 5 in a state where exfoliation or a nick is present in a part of the anisotropic conductive film S, it is considered that the junction of the electrode 122 of the liquid crystal panel 121 and the electrode of the semiconductor chip H with each other may become insufficient to thereby cause a defect. Accordingly, it is necessary to inspect the stuck state of the anisotropic conductive film S after the anisotropic conductive film S is stuck on the liquid crystal panel 121. For this reason, the bonding agent sticking inspection apparatus 111 inspects the stuck state of the anisotropic conductive film S.

The bonding agent sticking inspection apparatus 111 takes an image of an entire sticking expected range 200 indicating a position (range) of the liquid crystal panel 121 on which the anisotropic conductive film S is to be stuck, and sets inspection regions 202 in all the regions of the part in the X direction (the direction in which the electrodes 122 are arranged) in the peripheral edge part 201 of the sticking expected range 200 in the taken image. Further, the inspection regions 202 are inspected one by one, and it is judged on the basis of the inspection result whether or not any nick is caused in the anisotropic conductive film S.

At this time, when the sticking expected range 200 is larger than the visual field 19a (shown in FIG. 12) of the bonding agent recognition camera 19, the sticking expected range 200 is photographed several times so that the entire sticking expected range 200 can be photographed. Further, inspection is performed for each of the photographed images. Incidentally, the visual field 19a of the bonding agent recognition camera 19 implies a range photographed by one time photography of the bonding agent recognition camera 19. An operation of the bonding agent sticking inspection apparatus 111 will be specifically described below.

Incidentally, as shown in FIG. 10, the control apparatus 113 possesses in advance data on the position and the size of the anisotropic conductive film S to be stuck on the liquid crystal panel 121. Further, the control apparatus 113 possesses in advance data on the sticking expected range 200 on which the anisotropic conductive film S is to be stuck on the liquid crystal panel 121. The data indicating the position of the sticking expected range 200 is, for example, the coordinate data from the reference mark in the X direction and in the Y direction. Incidentally, in FIG. 10, the sticking expected range 200 on the liquid crystal panel 121 and the anisotropic conductive film S overlap each other.

Figure 11:
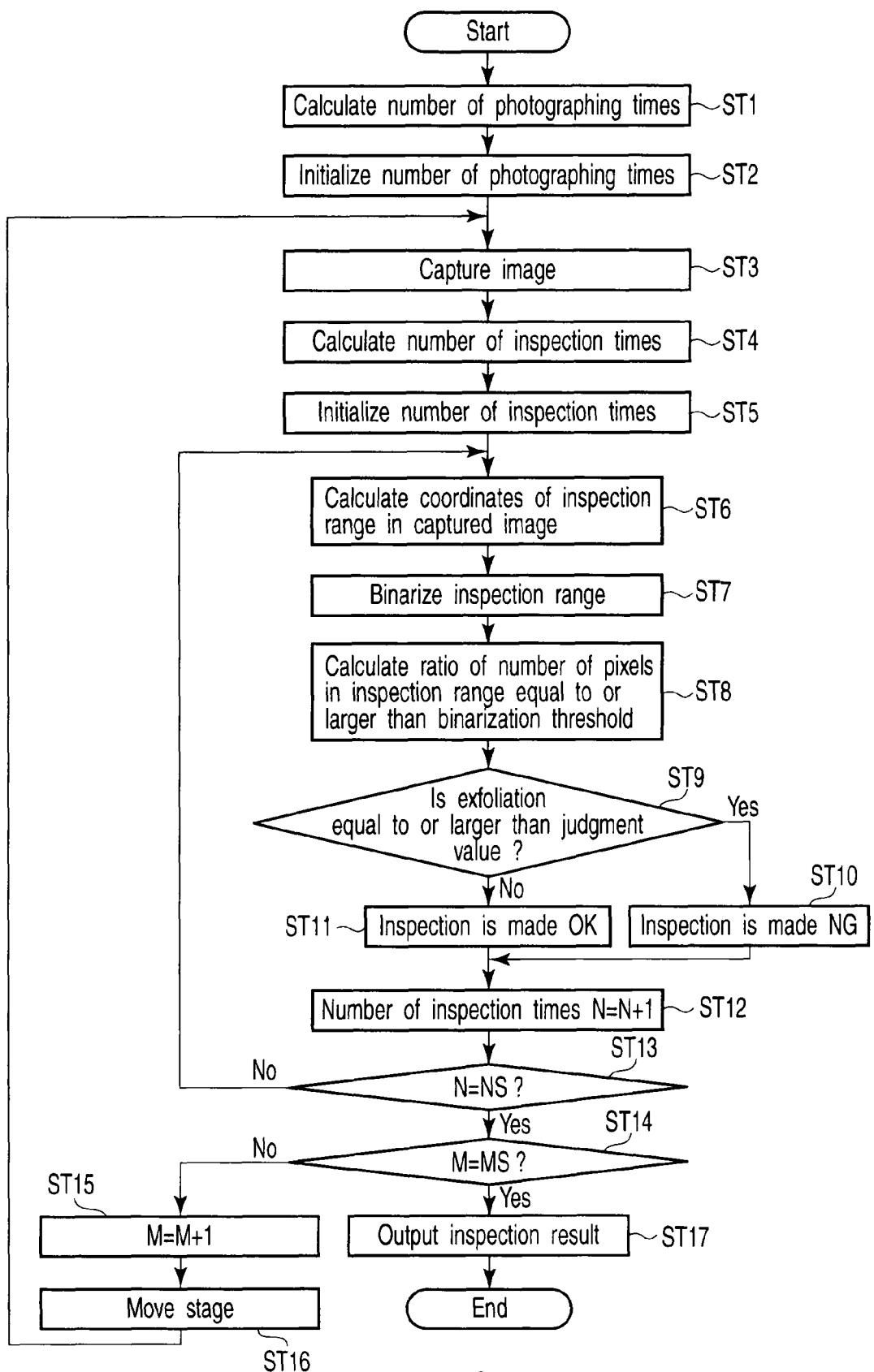
FIG. 11 is a flowchart showing an operation of the bonding agent sticking inspection apparatus shown in FIG. 2.

FIG. 11 is a flowchart showing an operation of the bonding agent sticking inspection apparatus 111. As described above, the entire sticking expected range 200 on the liquid crystal panel 121 is photographed. Accordingly, as shown in the flowchart of FIG. 11, in step ST1, the control apparatus 113 calculates the total number of photographing times necessary for photographing the entire sticking expected range 200 from the data on the size of the sticking expected range 200 possessed in advance by the apparatus 113, and the data on the visual field 19a of the bonding agent recognition camera 19. The total number of photographing times is set as Ms.

Figure 12:
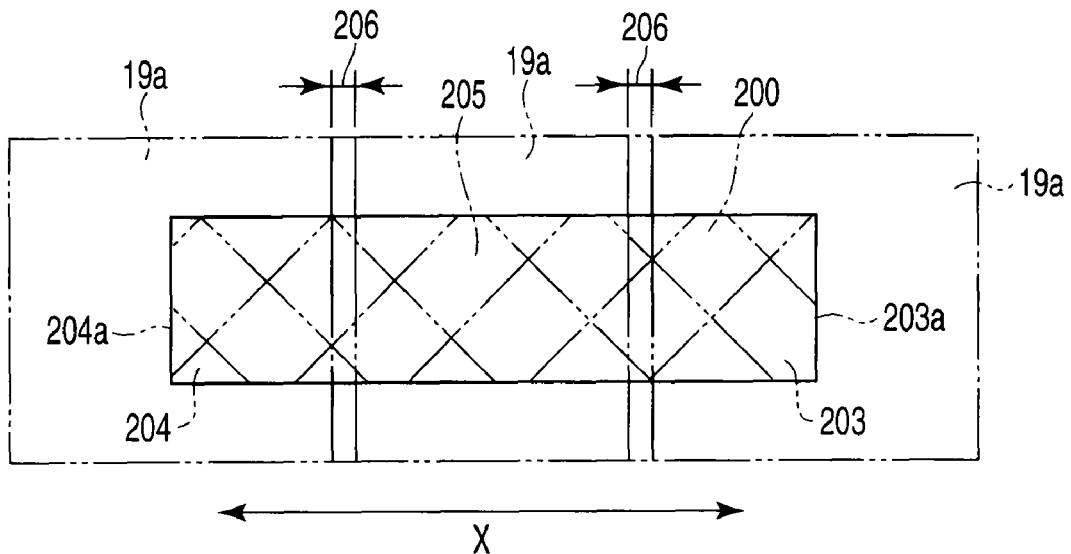
FIG. 12 is a plan view schematically showing the range in which sticking is to be performed, and a visual field of a bonding agent recognition camera.

FIG. 12 is a plan view schematically showing the sticking expected range 200, and the visual field 19a of the bonding agent recognition camera 19. In FIG. 12, the sticking expected range 200 is indicated by a two-dot chain line, and is indicated by hatching. The visual field 19a of the bonding agent recognition camera 19 is indicated by a two-dot chain line. As shown in FIG. 11, in this embodiment, in order to photograph the entire sticking expected range 200, the bonding agent recognition camera 19 photographs the range 200 three times, i.e., one end part 203 of the sticking expected range 200, the other end part 204 thereof, and an intermediate part 205 between both the end parts 203 and 204.

That is, Ms=3. Incidentally, in FIG. 12, a reference symbol 206 indicates a part at which an image taken last time and an image taken next overlap each other. The overlap part 206 will be described later in detail. Incidentally, in FIG. 12, the X direction is indicated, and the visual field 19a of the bonding agent recognition camera 19 is adjacent to the indicated X direction.

Subsequently, as shown in FIG. 11, the flow is advanced to step ST2. In step ST2, the number of photographing times M of the bonding agent recognition camera 19 is set at an initial state, i.e., M is set at 0 (M=0). Then, the flow is advanced to step ST3. In step ST3, the sticking expected range 200 is photographed by the bonding agent recognition camera 19 once. The one end part 203 which is the leading end part in the direction in which the second conveyance mechanism 8B is advanced (the downstream side in the X direction) in the sticking expected range 200 is first photographed. The second conveyance mechanism 8B is moved so that the bonding agent recognition camera 19 can photograph the one end part 203.

Figure 13:
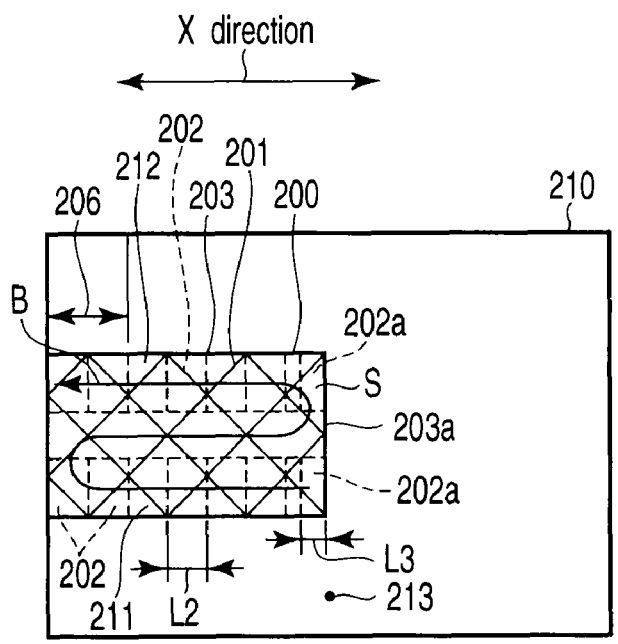
FIG. 13 is a plan view showing an image, taken by the bonding agent recognition camera shown in FIG. 2, of one end part of the range in which sticking is to be performed.

FIG. 13 shows an image 210 of the one end part 203 photographed by the bonding agent recognition camera 19. Incidentally, the anisotropic conductive film S is stuck on the sticking expected range 200 in FIG. 13, and hence the sticking expected range 200 in FIG. 13 and the anisotropic conductive film S overlap each other. In FIG. 13, the anisotropic conductive film S is indicated by hatching.

As shown in FIG. 13, in this embodiment, each of both the end parts 203 and 204 of the sticking expected range 200 is photographed in a state where each of both the ends 203a and 204a is positioned at the center of the visual field 19a of the bonding agent recognition camera 19 in the X direction.

Accordingly, the second conveyance mechanism 8B is driven by the control of the control apparatus 113 in such a manner that the one end 203a at the leading end in the direction in which the second conveyance mechanism 8B is advanced (downstream side in the X direction) overlaps the center of the visual field 19a of the bonding agent recognition camera 19 in the X direction. Incidentally, the control of the drive of the second conveyance mechanism 8B is performed on the basis of the position data of the sticking expected range on the liquid crystal panel 121 held in advance in the control apparatus 113 as described above.

When the one end 203a reaches the center of the visual field 19a of the bonding agent recognition camera 19, the one end part 203 of the sticking expected range 200 is photographed by the bonding agent recognition camera 19. The image 210 of the photographed one end part 203 is transmitted to the control apparatus 113. In the control apparatus 113, the image 210 transmitted thereto is stored in the image capturing apparatus 113a. Subsequently, as shown in FIG. 11, the flow is advanced to step ST4.

In step ST4, the control apparatus 113 obtains the number of inspection regions 202 set in the image 210 stored in the image capturing apparatus 113a. The inspection region 202 is set at a part in the peripheral edge part 201 of the sticking expected range 200 in the X direction, which is the moving direction of the second conveyance mechanism 8B, as described above.

Further, the inspection regions 202 are inspected in sequence, one by one. That is, the number of inspection regions 202 in one image indicates the number of inspection times in the image. The control section 113 obtains the number of inspection regions 202 to be set in the image 210, i.e., the number of inspection times Ns in the image 210 from the relationship between the size of the sticking expected range 200 in the image 210 of the one end part 203 and the shape of one inspection region 202. The shape of the inspection region 202 is rectangular, a width L2 in the X direction is set at the same value as the pitch P between electrodes. In this embodiment, the pitch between electrodes is 0.2 mm.

Incidentally, the reason why the inspection region 202 is set at a part in the peripheral edge part 201 of the sticking expected range 200 in the moving direction of the second conveyance mechanism 8B, i.e., in the X direction is that a nick is liable to occur at the peripheral edge part of the anisotropic conductive film S. Incidentally, in FIG. 13, the group of inspection regions located at the lower position is named the lower inspection region group 211, and the group of inspection regions located at the upper position is named the upper inspection region group 212. In this embodiment, the intermediate part in the sticking expected range 200 in the Y direction, i.e., the range between the lower inspection region group 211 and the upper inspection region group 212 is not inspected. This is due to the reason described above.

Subsequently, as shown in FIG. 11, the flow is advanced to step ST5. In step ST5, the number of inspection times is initialized. That is, N is set at 0 (N=0).

Subsequently, the flow is advanced to step ST6. As described above, the inspection regions 202 are inspected in sequence one by one. Therefore, in step ST6, the coordinates of one inspection region 202 to be actually inspected are calculated by using a reference point 213 set in the image taken by the bonding agent recognition camera 19 as a reference. More specifically, coordinates of four corners of the inspection region 202 to be inspected are calculated.

As shown in FIG. 13, the reference point 213 is set at a position in the visual field 19a of the bonding agent recognition camera 19 in the center in the X direction, and shifted from the sticking expected range 200 in the Y direction. In this embodiment, the reference point 213 is positioned lower than the sticking expected range 200 in FIG. 13. In other words, each of both the ends 203a and 204a of the sticking expected range 200 is set at a position overlapping the reference point 213 in the image in the X direction.

In this embodiment, as indicated by the arrow B in FIG. 13, after, for example, the inspection regions 202 in the lower inspection region group 211 are inspected, the inspection regions 202 in the upper inspection region group 212 are inspected. In the lower and upper inspection region groups 211 and 212, coordinates of the inspection regions 202 are set in sequence from the center in the X direction toward both sides in the X direction, thereby performing inspection.

Incidentally, the inspection is not limited to the inspection starting from the lower inspection region group 211 as described above. Further, the order of inspection of the inspection regions is not limited, and hence the order of inspection is not limited to the inspection in the order in sequence in the X direction as described above. The order of inspection of the inspection regions is set appropriately and suitably.

In each of both the end parts 203 and 204 of the sticking expected range 200, each of both the ends 203a and 204a is positioned at the center of the visual field 19a of the bonding agent recognition camera 19 as described above, and hence in each of the lower and upper inspection region groups 211 and 212, the inspection regions are set from each of the ends 203a and 204a in only one direction.

Incidentally, in the first inspection region 202 from each of both the ends 203a and 204a of the sticking expected range 200 in the X direction, a part 202a not to be inspected is set. A width L3 of the part 202a not to be inspected in the X direction is set at the same value as the sticking tolerance of the anisotropic conductive film S.

Figure 14:
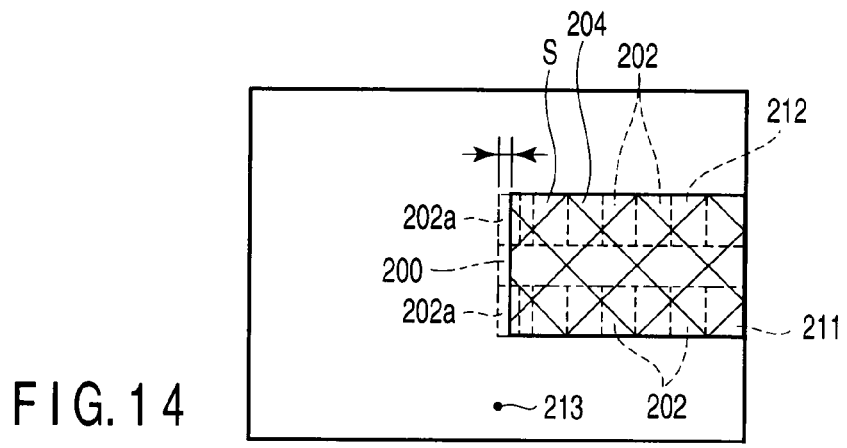
FIG. 14 is a plan view showing a state where a sticking position of the anisotropic conductive film is shifted by an amount corresponding to the tolerance.

By setting a part 202a not to be inspected having a width L3 of the same value as the sticking tolerance in the first inspection region 202 from each of both the ends 203a and 204a of the sticking expected range 200 in the X direction, a sticking error of the anisotropic conductive film S within the permissible range (within the tolerance) is not judged to be a nick. Incidentally, FIG. 14 is a plan view showing a state where the sticking position of the anisotropic conductive film S is shifted from the sticking expected range 200 by an amount corresponding to the tolerance.

Accordingly, in the lower and upper inspection region groups 211 and 212, coordinates indicating the part 202a not to be inspected (four corners of the part 202a not to be inspected) are calculated in the first inspection region 202 from each of both the ends 203a and 204a of the sticking expected range 200 in the X direction.

Then, the flow is advanced to step ST7 as shown in FIG. 11. In step ST7, the control section 113 discriminates parts with the anisotropic conductive film S and parts without the anisotropic conductive film S from each other on the basis of the image of the coordinates detected in step ST 6, i.e., the image in one inspection region 202 coordinates of which are set in step ST6.

More specifically, in the inspection region 202, the luminance is small in the part with the anisotropic conductive film S. Further, in the part without the anisotropic conductive film S, such as a nick, the luminance is large. Thus, the part with the anisotropic conductive film S and the part without the anisotropic conductive film S are discriminated from each other by comparing the luminance of each part in the inspection region 202 with a threshold set in advance. Further, binarization processing for blackening parts judged to have the anisotropic conductive film S, and whitening parts judged to have no anisotropic conductive film S is performed.

Then, the flow is advanced to step ST8. In step ST8, the number of pixels of the parts in the inspected inspection region 202 judged to be without the anisotropic conductive film S, i.e., the number of pixels of the whitened parts is detected, and the ratio of the number of pixels of the whitened parts to the total number of pixels in the inspection region 202 is calculated.

Then, the flow is advanced to step ST9. In step ST9, it is judged whether or not the value calculated in step ST8 is equal to or larger than a judgment value, the judgment value being a criterion for judging a value to cause any fault in the electrical connection between the electrode 122 and the semiconductor chip H. When the ratio of the parts judged to have no anisotropic conductive film S is equal to or larger than the judgment value, the flow is advanced to step ST10.

In step ST10, it is judged that there is a nick that causes a fault in the electrical connection between the electrode 122 and the semiconductor chip H in the inspection region 202 inspected in step ST7, and it is judged that there is an abnormality in the anisotropic conductive film S.

In step ST9, when the ratio of the parts judged to have no anisotropic conductive film S is smaller than the judgment value, the flow is advanced to step ST11. In step ST11, when the ratio of the parts judged to have no anisotropic conductive film S is smaller than the judgment value, it is judged that there is no nick that causes a fault in the electrical connection between the electrode 122 and the semiconductor chip H in the inspection region 202 inspected in step ST7.

Subsequently, the flow is advanced through steps ST10 and ST11 to step ST12. Incidentally, in steps ST6 to ST11, an inspection of one inspection region 202 is performed. Accordingly, in step ST12, the number of inspection times is increased by 1 (number of inspection times N=N+1). Then, the flow is advanced to step ST13.

In step ST13, it is judged whether or not all the plural inspection regions 202 set in the image 210 have been inspected. Therefore, it is judged in step ST13 whether or not the number of inspection times N has reached the total number of inspection times Ns set in step ST4. Before all the inspection regions 202 set in the image 210 of the one end part 203 are inspected, the flow is returned to step ST6, and inspection of the inspection regions 202 is continued to be performed one by one. At this time, the inspection regions 202 set in the image 210 are inspected first from the lower inspection region group 211, and when the inspection of the lower inspection region group 211 is completed, the upper inspection region group 212 is inspected. Further, in an inspection region 202 in each of the lower and upper inspection region groups 211 and 212, inspection is started from the center in the X direction, and is performed in sequence in the order in the X direction.

When all the inspection regions 202 in the image 210 of the one end part 203 have been inspected, the number of inspection times N becomes Ns (N=Ns), and the flow is advanced from step ST13 to step ST14. In step ST14, it is judged whether or not inspection of the entire sticking expected range 200 has been completed. Therefore, it is judged in step ST14 whether or not the number of photographing times M of the bonding agent recognition camera 19 has reached the total number of photographing times Ms set in step ST1.

At a point in time at which the inspection of the inspection regions 202 in the one end part 203 is completed, inspection of the other end part 204, and inspection of the intermediate part 205 of the sticking expected range 200 are still left undone, and hence the flow is advanced to step ST15. In step ST15, the number of photographing times M becomes M+1 (M=M+1), and the number of photographing times is increased by 1 (M=1). Subsequently, the flow is shifted to the inspection of the intermediate part 205.

To perform the inspection of the intermediate part 205, the flow is advanced to step ST16. In step ST16, the control apparatus 113 drives the second conveyance mechanism 8B in such a manner that the center of the intermediate part 205 in the X direction overlaps the center of the visual field 19a of the bonding agent recognition camera 19 in the X direction. Incidentally, the control apparatus 113 possesses the data on the size and position of the sticking expected range 200, and the data on the size of the visual field 19a of the bonding agent recognition camera 19, and hence the control apparatus 113 can drive the second conveyance mechanism 8B in order to put the intermediate part 205 in the visual field 19a of the bonding agent recognition camera 19.

Here, the overlap part 206 of the photographing ranges will be described below in detail. As shown in FIG. 12, depending on the size of the sticking expected range 200, even by the repeated photographing of the bonding agent recognition camera 19 of several times, the entire region of the sticking expected range 200 is not photographed, and a part (a range smaller than the visual field of the bonding agent recognition camera 19) thereof may be left undone without being photographed in some cases.

As described above, in this embodiment, each of both the end parts 203 and 204 of the sticking expected range 200 is photographed in a state where each of both the ends 203a and 204a is positioned at the center of the visual field 19a of the bonding agent recognition camera 19 in the X direction. Therefore, when a part of the sticking expected range 200 is left unphotographed, the control apparatus 113 corrects the drive of the second conveyance mechanism 8B in such a manner that each of both the ends 203a and 204a is positioned at the center of the visual field 19a of the bonding agent recognition camera 19, and the photographing ranges adjacent to each other in the sticking expected range 200 overlap each other. The overlap part 206 at which images overlap each other is controlled to become uniform. Incidentally, in FIGS. 13, 15, and 16, the overlap part 206 is depicted enlarged in an exaggerated fashion.

Figure 15:
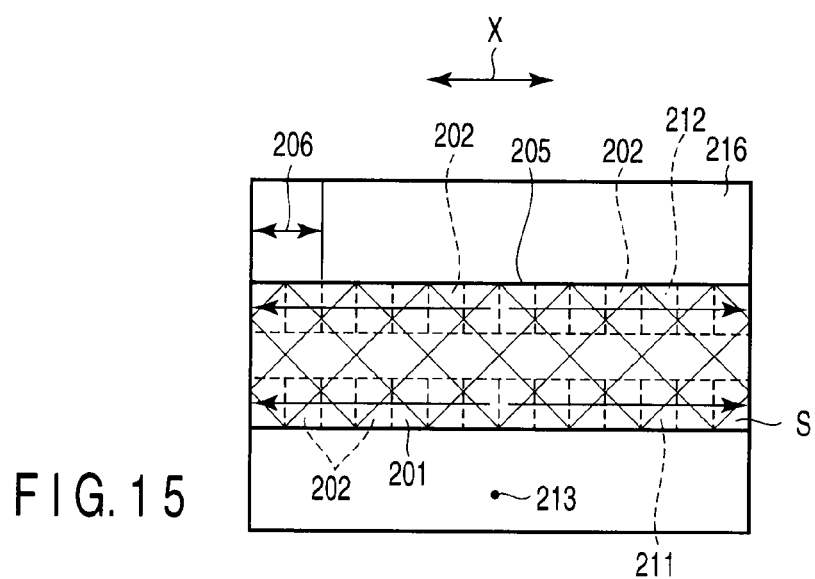
FIG. 15 is a plan view showing an image of an intermediate part of the range taken by the bonding agent recognition camera shown in FIG. 2 in which sticking is to be performed.

Subsequently, the flow is returned to step ST3. In step ST3, the intermediate part 205 is photographed by the bonding agent recognition camera 19. FIG. 15 is an image 216 of the intermediate part 205. The image 216 is preserved in the image capturing apparatus 113a of the control apparatus 113.

Then, the flow is advanced to step ST4. In step ST4, the number of inspection regions 202 to be set in the intermediate part 205, i.e., the number of inspection times Ns to be performed in the intermediate part 205 is obtained. Subsequently, the flow is advanced to step ST5. In step ST5, the number of inspection times is initialized. That is, N is set at 0 (N=0). Then, the flow is advanced to step ST6.

In step ST6, coordinates of one inspection region 202 to be inspected in step ST7 are calculated. Incidentally, as shown in FIG. 15, the sticking expected range 200 is present on either side of the center (reference point 213) of the visual field 19a of the bonding agent recognition camera 19 in the X direction unlike the sticking expected range 200 in both the end parts 203 and 204.

In this embodiment, in the intermediate part 205, inspection is performed, as indicated by the arrows in FIG. 15, in sequence from the reference point 213 in one direction, for example, in the direction, of the X directions, to the downstream side, and thereafter inspection is performed in sequence from the reference point 213 in the other direction, for example, in the direction, of the X directions, to the upstream side. In the intermediate part 205, the inspection regions 202 are inspected one by one in accordance with steps ST6 to ST13. Therefore, description of steps ST6 to ST13 in the intermediate part 205 is omitted.

When the inspection of the inspection regions 202 in the sticking expected range 200 in the intermediate part 205 is completely finished, the number of photographing times M becomes M+1, i.e., M=M+1, and M becomes 2 (M=2). Thus, the inspection of the intermediate part is completed. Then, the flow is shifted to the inspection of the other end part 204.

In order to shift the flow to the inspection of the other end part 204, the flow is returned to step ST3. In step ST3, the second conveyance mechanism 8B is driven by the control of the control apparatus 113 in such a manner that the end 204a of the other end part 204 overlaps the reference point 213 in the visual field 19a of the bonding agent recognition camera 19 in the X direction. Subsequently, the flow is advanced to step ST4.

Figure 16:
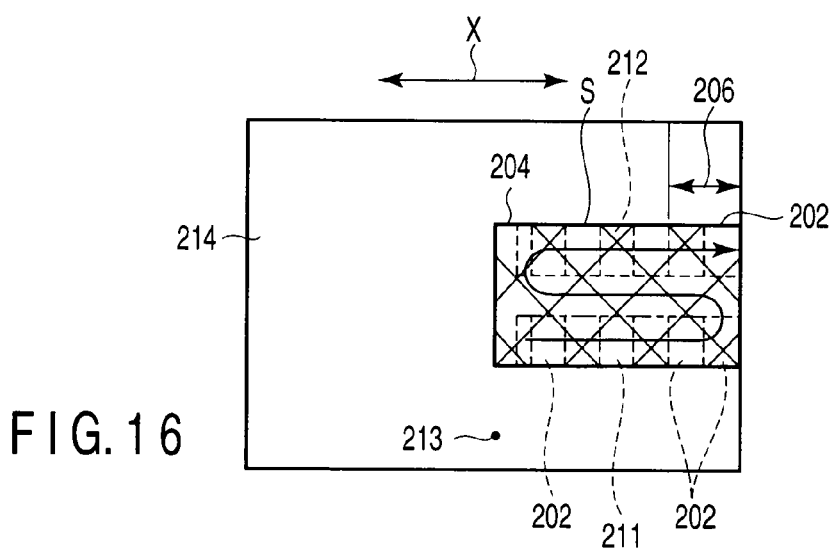
FIG. 16 is a plan view showing an image, taken by the bonding agent recognition camera shown in FIG. 2, of the other end part of the range in which sticking is to be performed.

In step ST3, the other end part 204 is photographed. FIG. 16 is an image 214 of the other end part 204. The image 214 is preserved in the image capturing apparatus 113a of the control apparatus 113. Steps ST4 to ST13 in the inspection of the sticking expected range 200 in the other end part 204 are performed in the same manner as the inspection of the sticking expected range 200 in the one end part 203, and hence the description of the steps is omitted.

When the inspection of the inspection regions 202 in the sticking expected range 200 in the other part 204 is completely finished, the number of photographing times M becomes 3 (M=3) in step ST14, and M becomes Ms (M=Ms). Then, the flow is advanced to ST17. In step ST17, an output indicating whether or not an abnormality is present in the anisotropic conductive film S is provided on the basis of the inspection results of all the inspection regions 202 (all the inspection regions 202 in the sticking expected range 200) in the one end part 203, the other end part 204, and the intermediate part 205.

The above inspection result is output from an output apparatus such as a monitor 113b (shown in FIG. 1) connected to the control apparatus 113. Incidentally, if it is judged in any one of the plural inspection regions 202 in step ST10 that an abnormality is present, it is output in step ST17 that an abnormality is present in the anisotropic conductive film S.

Incidentally, in this embodiment, the sticking expected range 200 has a size the entire range of which can be photographed by the triple shooting of the bonding agent recognition camera 19. Therefore, the sticking expected range 200 is divided into three parts; the one end part 203, the other end part 204, and the intermediate part 205. However, depending on the size of the sticking expected range 200, the range 200 is divided into more than three parts, such as four or five parts, in some cases. In such a case, the range 200 is divided into the one end part 203, the other end part 204, and a plurality of intermediate parts. These intermediate parts are also inspected in the same manner.

As shown in FIG. 2, the liquid crystal panel 121 which has been judged to be free from abnormalities in the inspection of the anisotropic conductive film S performed by the bonding agent sticking inspection apparatus 111 is conveyed to the temporary pressure bonding apparatus 4 by the second conveyance mechanism 8B. In the temporary pressure bonding apparatus 4, the liquid crystal panel 121 is transferred to the temporary pressure bonding stage 20.

When it is judged by the bonding agent sticking inspection apparatus 111 that an abnormality is present in the anisotropic conductive film S, the mounting apparatus 110 is stopped. Further, the liquid crystal panel 121 that has been judged to be abnormal is removed by a worker or the like.

The temporary pressure bonding stage 20 is moved from the inner side of the mounting apparatus in the Y direction, once moved to the front side of the apparatus, and the liquid crystal panel 121 is transferred from the second conveyance mechanism 8B to the temporary pressure bonding stage 20.

The liquid crystal panel 121 is fixed to the temporary pressure bonding stage 20 by suction/attraction. The end edges of the glass plate a1 excluding the glass plate a2 constituting the liquid crystal panel 121, and the two polarizing plates b1 and b2 of the liquid crystal panel 121 at this time are made flush with the end edge of the stage 20. Further, the protruded part of the glass plate a2 protrudes from the end edge of the temporary pressure bonding stage 20. The temporary pressure bonding stage 20 moves to the inner side (Y direction) while holding the liquid crystal panel 121 by suction/attraction, approaches the backup stage 21, and moves to a position above the stage 21.

The temporary pressure bonding stage 20 lowers to a height position at which the back surface of the protruded part of the liquid crystal panel 121 comes into contact with the backup stage 21. At this time too, control is performed on the basis of the result of the height measurement on the first stage 10 of the pre-alignment apparatus 2 described previously, the top surface of the backup stage 21 and the back surface of the protruded part of the liquid crystal panel 121 are therefore brought into uniform contact with each other, and the liquid crystal panel 121 is held horizontal at all times.

On the other hand, the semiconductor chip H is transferred from the IC supply unit 142 to the IC conveyance apparatus 7. When the semiconductor chip H is supplied in a state where the electrode (bump) formed thereon faces upward, the semiconductor chip H is received by the suction/attraction section 27 of the chip inversion mechanism 24 constituting the IC conveyance apparatus 7, and is held by vacuum suction/attraction as shown in FIG. 17.

Further, as shown in FIG. 17B, the half rotation mechanism 28 is driven to rotate the suction/attraction section 27 by 180°, and is then stopped. The suction/attraction function of the suction/attraction section 27 exerted on the semiconductor chip H is continued, and the semiconductor chip H is held upside down.

Then, as shown in FIG. 17C, the elevator mechanism 29 is driven to lower the half rotation mechanism 28 together with the suction/attraction section 27, and is then stopped at a position at which the semiconductor chip H is placed on the chip stage 25 of the chip conveyance mechanism 26.

The chip stage 25 of the chip conveyance mechanism 26 fixes the semiconductor chip H thereto by vacuum suction/attraction, and then the vacuum suction/attraction at the suction/attraction section 27 of the chip inversion mechanism 24 is canceled. Thus, the semiconductor chip H has been transferred from the chip inversion mechanism 24 to the chip stage 25. At this timing, the chip conveyance mechanism 26 is driven to convey the chip stage 25 together with the semiconductor chip H to the temporary pressure bonding apparatus 4.

The elevator mechanism 29 of the chip inversion mechanism 24 is driven to ascend, and the half rotation mechanism 28 is rotated in the reverse direction by half a rotation. The chip inversion mechanism 24 is returned to its initial posture, and waits for the supply of a semiconductor chip to be supplied next time. On the other hand, the chip conveyance mechanism 26 is stopped in a state where the semiconductor chip H supported on the chip stage 25 has been conveyed to a position at which the semiconductor chip H is opposed to the temporary pressure bonding head 22.

Incidentally, depending on the type, there may be a case where the mounting surface of the electronic component transferred from the chip supply means faces downward. In such a case, the supply of the electronic component to the chip inversion mechanism 24 can be omitted, and the electronic component can be directly transferred to the chip stage 25 of the chip conveyance mechanism 26. As a result of this, the productivity can be enhanced.

When the chip stage 25 of the chip conveyance mechanism 26 to which the semiconductor chip H is fixed by suction/attraction is stopped at the position at which the semiconductor chip H held thereon is opposed to the temporary pressure bonding head 22, the temporary pressure bonding head 22 lowers at this time, and comes into contact with the semiconductor chip H on the chip stage 25. Then, the suction/attraction function of the chip stage 25 is stopped, and the vacuum suction/attraction function to be exerted on the semiconductor chip H of the temporary pressure bonding head 22 is started, whereby semiconductor chip H is transferred to the temporary pressure bonding head 22.

Further, as shown in FIG. 2, the temporary pressure bonding head 22 is driven to be raised and moved in the X and Y directions, and is stopped at a position above the recognition camera 23 within the photographing range of the camera 23. Further, the recognition camera 23 photographs the recognition mark (not shown) provided on the semiconductor chip H. Subsequently, the mounting part of the liquid crystal panel 121 protruding from the temporary pressure bonding stage 20 is also moved to the photographing range of the recognition camera 23, and the recognition camera 23 photographs the reference mark M of the liquid crystal panel 121.

The image capturing apparatus 113a provided in the control apparatus 113 receives a photography signal from the recognition camera 23, and calculates the misregistration amount associated with the regular position of the semiconductor chip H on the liquid crystal panel 121 set in advance by using the recognition mark of the semiconductor chip H and the reference mark M of the liquid crystal panel 121.

On the basis of the above calculation result, the temporary pressure bonding head 22 supporting the semiconductor chip H facing downward by suction/attraction moves in the horizontal direction (X and Y directions) and the rotational direction (θ direction) in the horizontal plane, and performs positioning of the semiconductor chip H on the liquid crystal panel 121.

The temporary pressure bonding head 22 lowers toward the liquid crystal panel 121 on the backup stage 21 at a proper timing, and temporarily pressure-bonds the semiconductor chip H to the mounting surface of the liquid crystal panel 121 through the anisotropic conductive film S by applying a predetermined weight thereto and by heating them at a predetermined temperature. This allows the temporary pressure bonding step to be completed.

As described above, by means of the recognition camera 23 of the temporary pressure bonding apparatus 4, the positions of the semiconductor chip H and the liquid crystal panel 121 are recognized to thereby calculate the misregistration amount between the positions, position correction is performed on the basis of the calculation result, thereby positioning the semiconductor chip H on the liquid crystal panel 121 with very high accuracy. At the same time, the height position of the liquid crystal panel 121 is corrected, and the liquid crystal panel 121 is held horizontal, whereby the temporary pressure bonding can be performed without the semiconductor chip H being misregistered by distortion resulting from the inclination or pressing of the liquid crystal panel 121.

When the temporary pressure bonding step is completed, the third conveyance mechanism 8C is operated to take out the liquid crystal panel 121 to which the semiconductor chip H is temporarily pressure-bonded from the temporary pressure bonding apparatus 4, and convey the panel 121 to the regular pressure bonding apparatus 5. In the regular pressure bonding apparatus 5, the liquid crystal panel 121 is transferred to the regular pressure bonding stage 30 which has moved from the apparatus inner side to the front side in the Y direction.

After transferring the liquid crystal panel 121 to any one of the three regular pressure bonding stages 30, the third conveyance mechanism 8C immediately returns to the temporary pressure bonding apparatus 4, and transfers the next liquid crystal panel 121 to the other regular pressure bonding stage 30. Further, the third conveyance mechanism 8C returns to the temporary pressure bonding apparatus 4 again, and transfers another liquid crystal panel 121 to the empty remaining regular pressure bonding stage 30.

The regular pressure bonding stage 30 to which the liquid crystal panel 121 has been transferred moves to the apparatus inner side (Y direction) again, then lowers, and stops at a position at which the mounting surface of the liquid crystal panel 121 to which the semiconductor chip H is temporarily pressure-bonded is placed on the backup stage 31. The lowering amount of the regular pressure bonding stage 30 at this time is also based on the result of the measurement previously performed by the laser displacement gauge 12 of the pre-alignment apparatus 2, and hence the mounting part of the liquid crystal panel 121 is held horizontal at all times.

After this, the regular pressure bonding head 32 lowers toward the mounting surface of the liquid crystal panel 121 on the backup stage 31, and performs the regular pressure bonding step. The regular pressure bonding step is a step of regularly pressure-bonding the semiconductor chip to the liquid crystal panel 121 through the protective tape T on the basis of a higher heating temperature and a larger weight condition than the temporary pressure bonding step. As a result of this, the electrode of the semiconductor chip H and the electrode of the liquid crystal panel 121 is connected to each other through conductive particles contained in the anisotropic conductive layer which is the anisotropic conductive film S, and substantial mounting is performed.

The liquid crystal panel 121 that has been subjected to the regular pressure bonding step is held by the fourth conveyance mechanism 8D by suction/attraction, and is conveyed to the discharging apparatus 6. Further, the liquid crystal panel 121 that has passed the regular pressure bonding step is transferred to the discharging stage 35.

The discharging stage 35 moves (X direction) to the transfer position at which transfer to the buffer unit 150 on the downstream side is performed, and transfers the liquid crystal panel 121 to the buffer unit 150. As a result of this, the entire series of mounting steps of mounting the semiconductor chip on the liquid crystal panel 121 is completed.

In the mounting apparatus 110 configured as described above, the width L2 of the inspection region 202 is made equal to the pitch between electrodes. As a result of this, it becomes possible for the bonding agent sticking inspection apparatus 111 to judge a nick that may cause a fault in the electrical connection between the electrode 122 and the semiconductor chip H to be abnormal.

Figure 18:
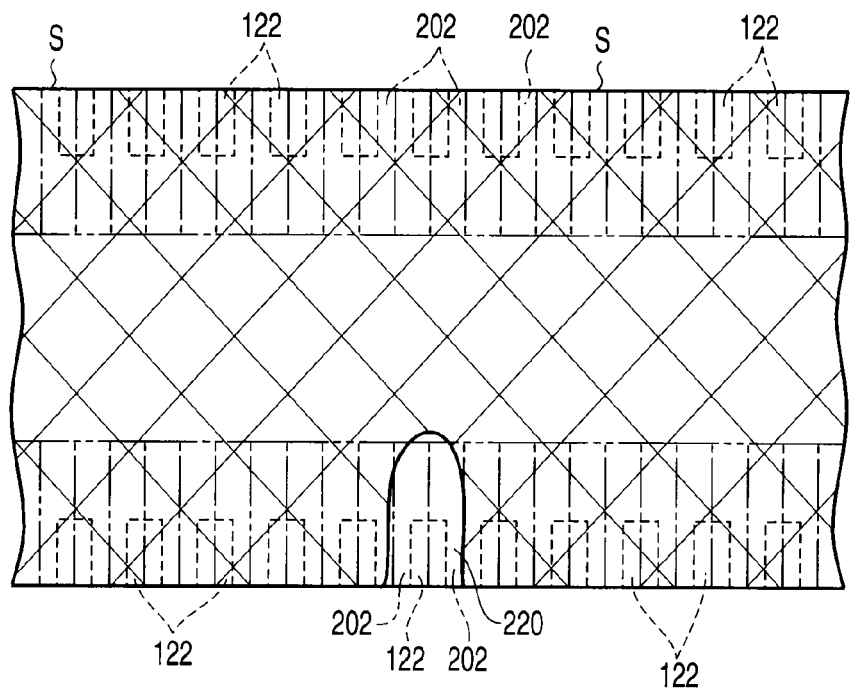
FIG. 18 is a plan view showing a state where a nick is caused in the anisotropic conductive film when a width of the inspection region is equal to a pitch between electrodes.

This point will be specifically described below. FIG. 18 is a plan view showing a state where a nick 220 is caused in the anisotropic conductive film S when the width L2 of the inspection region 202 is equal to the pitch between electrodes. In FIG. 18, the anisotropic conductive film S is indicated by hatching. The electrodes 122 are indicated by dotted lines. The inspection regions 202 are indicated by two-dot chain lines.

As shown in FIG. 18, the nick 220 has a size totally covering an electrode 122, and covering substantially two inspection regions 202.

Figure 19:
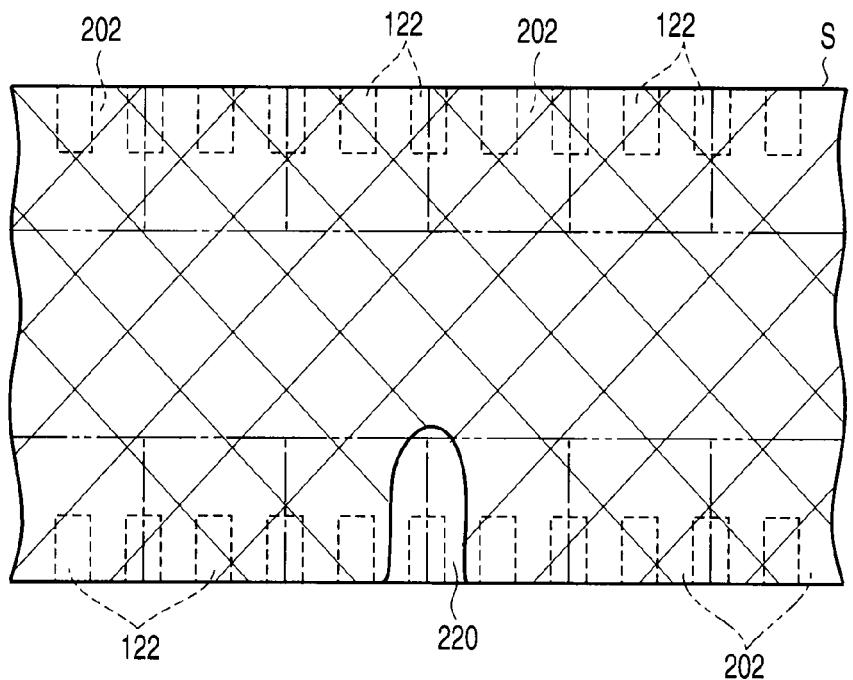
FIG. 19 is a plan view showing a state where a nick is caused in the anisotropic conductive film when the width of the inspection region is set larger than the pitch between electrodes.

FIG. 19 shows a case where the width L2 of the inspection region 202 is set larger than the pitch between electrodes. Incidentally, the nick 220 shown in FIG. 19 has the same size and shape as the nick 220 shown in FIG. 18. In FIG. 19, the nick 220 entirely covers the one electrode 122, but covers only a part of an inspection region 202.

Accordingly, in the case of FIG. 19, even when one electrode 122 is covered by the nick 220, if the ratio of the area occupied by the nick 220 to the inspection region 202 is smaller than a threshold, the nick is judged to be within a normal range.

Conversely, in the case of FIG. 18, the width L2 of the inspection region 202 is equal to the pitch between electrodes, and thus the nick 220 having a size totally covering one electrode 122 fully covers the inspection region 202. As a result of this, the nick is judged to be abnormal.

As has been described above, the width L2 of the inspection region 202 is equal to the pitch P between electrodes, whereby it becomes possible to judge a nick that may cause a fault in the electrical connection between the electrode 122 and the semiconductor chip H with high accuracy.

Further, in an inspection region 202 adjacent to each of the ends 203a and 204a of the sticking expected range 200, a part 202a not to be inspected is set. As a result of this, a sticking error of the anisotropic conductive film S within the tolerance is not judged to be abnormal, and hence it becomes possible to accurately judge a nick that may cause a fault in the electrical connection between the electrode 122 and the semiconductor chip H.

Incidentally, in this embodiment, the mounting apparatus 110 of the IC mounting unit 140 has been described as a representative. However, the mounting apparatus 110 is not limited to being used in the IC mounting unit 140. For example, the mounting apparatus may be used in an FPC mounting unit 160. Even in this case, the same effect can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A bonding agent sticking inspection apparatus comprising:
a photographing section for photographing an image of a substrate on which a plurality of electrodes are arranged at predetermined pitches between electrodes in such a manner that the image includes a sticking expected range indicating a range in which a bonding agent to be interposed between the electrodes and a component to be electrically connected to the electrodes should be positioned;
a movement section for guiding the substrate into a visual field of the photographing section; and
a control section for controlling the photographing section and the movement section in order to photograph an entire region of the sticking expected range, setting an inspection region having a width equal to the pitch between electrodes in an entire edge part in a direction in which the electrodes are arranged in a peripheral edge part of the sticking expected range in the image photographed by the photographing section, detecting a ratio of a nicked part of the bonding agent to the inspection region, and judging whether or not an abnormality is present in the bonding agent on the basis of a comparison between the ratio of the nicked part and a threshold set in advance.

2. The bonding agent sticking inspection apparatus according to claim 1, wherein another inspection region is set and
the control section sets a range not to be inspected having a width equal to a sticking tolerance of the bonding agent in an inspection region, of the plural inspection regions, adjacent to each of ends of the sticking expected range in the direction in which the electrodes are arranged.

3. A mounting apparatus comprising:
a bonding agent sticking section for sticking a bonding agent on a plurality of electrodes arranged on a substrate at predetermined pitches between electrodes;
a bonding agent sticking inspection section for inspecting a stuck state of the bonding agent, the bonding agent sticking inspection section including:
a photographing section for photographing an image which includes a sticking expected range indicating a range in which a bonding agent to be interposed between the electrodes and a component to be electrically connected to the electrodes should be positioned;
a movement section for guiding the substrate into a visual field of the photographing section; and
a control section for controlling the photographing section and the movement section in order to photograph an entire region of the sticking expected range, setting an inspection region having a width equal to the pitch between electrodes in an entire edge part in a direction in which the electrodes are arranged in a peripheral edge part of the sticking expected range in the image photographed by the photographing section, detecting a ratio of a nicked part of the bonding agent to the inspection region, and judging whether or not an abnormality is present in the bonding agent on the basis of a comparison between the ratio of the nicked part and a threshold set in advance; and
an attaching section for attaching a component to be connected with the bonding agent interposed between the substrate and the component.

4. The mounting apparatus according to claim 3, wherein another inspection region is set and
the control section sets a range not to be inspected having a width equal to a sticking tolerance of the bonding agent in an inspection region, of the plural inspection regions, adjacent to each of ends of the sticking expected range in the direction in which the electrodes are arranged.

5. A method of manufacturing an electrical component comprising bonding agent sticking inspection steps of
photographing an entire region of a sticking expected range set in such a manner that the sticking expected range includes a range in which a plurality of electrodes are arranged on a substrate, and indicating a range in which a bonding agent should be positioned;
setting an inspection region having a width equal to the pitch between electrodes in an entire range in a direction in which the electrodes are arranged in a peripheral edge part of the sticking expected range in the photographed image;

discriminating parts having the bonding agent and parts having no bonding agent in the inspection region from each other on the basis of a comparison with a threshold set in advance;

detecting a ratio of the parts having no bonding agent to the inspection region; and judging that there is a nick in the inspection region on the basis of a comparison between the ratio of the parts having no bonding agent and a threshold set in advance.

6. The method of manufacturing an electrical component according to claim 5, wherein another inspection region is set and a range not to be inspected having a width equal to a sticking tolerance of the bonding agent is set in an inspection region, of the plural inspection regions, adjacent to each of ends of the sticking expected range in the direction in which the electrodes are arranged.

* * * * *